US006980056B1

(12) United States Patent
Alexander et al.

(10) Patent No.: US 6,980,056 B1
(45) Date of Patent: Dec. 27, 2005

(54) MULTIPLE STAGE ATTENUATOR

(75) Inventors: Mark Alexander, Austin, TX (US); Krishnan Subramonium, Austin, TX (US); Golam Chowdhury, Austin, TX (US); Kartika Prihadi, Austin, TX (US); Bryan Cope, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 727 days.

(21) Appl. No.: 09/711,770

(22) Filed: Nov. 13, 2000

Related U.S. Application Data

(60) Continuation of application No. 09/631,924, filed on Aug. 3, 2000, and a division of application No. 08/833,185, filed on Apr. 4, 1997, now Pat. No. 6,259,957.

(51) Int. Cl.[7] .......................... H03G 3/10; H03G 3/30

(52) U.S. Cl. .................... 330/284; 381/120; 333/81 R

(58) Field of Search .............................. 381/120, 104, 381/107, 109; 330/284, 61 R, 310, 133; 333/81 R; 327/308

(56) References Cited

U.S. PATENT DOCUMENTS 4,354,159 A * 10/1982 Schorr et al. ................. 330/86
4,500,845 A * 2/1985 Ehni .......................... 330/86
5,249,225 A * 9/1993 Williams .................... 379/404
5,486,791 A * 1/1996 Spitalny et al. ............. 330/282
5,523,721 A * 6/1996 Segawa et al. ............... 330/86
5,955,919 A * 9/1999 Lubbe et al. ................. 330/86
6,147,558 A * 11/2000 Sculley ....................... 330/284
6,259,957 B1 * 7/2001 Alexander et al. ............ 700/94
6,693,491 B1 * 2/2004 Delano ....................... 330/282
6,819,768 B1 * 11/2004 Sculley ....................... 381/104
6,876,243 B2 * 4/2005 Behzad ....................... 327/308

* cited by examiner

*Primary Examiner*—Xu Mei

(57) ABSTRACT

An attenuator includes a first stage 601*a* having a first operational amplifier 602*a* and a tapped resistor 603*a*. Tapped resistor 603*a* has an input for receiving input data, an output coupled to an output of first operational amplifier 602*a*, and a plurality of taps for selectively presenting a sequence of voltages to a noninverting input of first operational amplifier 602*a*. Each of these sequences of voltages corresponds to an attenuation step such that first stage 601*a* steps the attenuation produced by the attenuator from an intermediate value to a predetermined ending value. A second stage 601*b* includes a second operational amplifier 602*b* and a tapped resistor 603*b*. Tapped resistor 603*b* includes an input for receiving analog data from first stage 601*a*, an output coupled to an output of second operational amplifier 602*b*, and a plurality of taps for selectively presenting a sequence of voltages to a noninverting input of operational amplifier 602*b*. Each of the sequence of voltages corresponds to an attenuation step, a second stage 601*b* stepping the attenuation from a predetermined starting value to the intermediate value.

5 Claims, 12 Drawing Sheets

MASTER VOLUME (INDEX 02h)

| D15 | D14 | D13 | D12 | D11 | D10 | D9 | D8 | D7 | D6 | D5 | D4 | D3 | D2 | D1 | D0 |
|---|---|---|---|---|---|---|---|---|---|---|---|---|---|---|---|
| MUTE | X | ML5 | ML4 | ML3 | ML2 | ML1 | ML0 | X | X | MR5 | MR4 | MR3 | MR2 | MR1 | MR0 |

FIG. 4A

ALTERNATE VOLUME (INDEX 04h)

| D15 | D14 | D13 | D12 | D11 | D10 | D9 | D8 | D7 | D6 | D5 | D4 | D3 | D2 | D1 | D0 |
|---|---|---|---|---|---|---|---|---|---|---|---|---|---|---|---|
| MUTE | X | ML5 | ML4 | ML3 | ML2 | ML1 | ML0 | X | X | MR5 | MR4 | MR3 | MR2 | MR1 | MR0 |

FIG. 4B

MASTER MONO VOLUME (INDEX 06h)

| D15 | D14 | D13 | D12 | D11 | D10 | D9 | D8 | D7 | D6 | D5 | D4 | D3 | D2 | D1 | D0 |
|---|---|---|---|---|---|---|---|---|---|---|---|---|---|---|---|
| MUTE | X | X | X | X | X | X | X | X | X | MM5 | MM4 | MM3 | MM2 | MM1 | MM0 |

FIG. 4C

PC_BEEP VOLUME (INDEX 0Ah)

| D15 | D14 | D13 | D12 | D11 | D10 | D9 | D8 | D7 | D6 | D5 | D4 | D3 | D2 | D1 | D0 |
|---|---|---|---|---|---|---|---|---|---|---|---|---|---|---|---|
| MUTE | X | X | X | X | X | X | X | X | X | X | PV3 | PV2 | PV1 | PV0 | X |

FIG. 4D

ANALOG MIXER INPUT GAIN REGISTERS (INDEX OC_18h)

| D15 | D14 | D13 | D12 | D11 | D10 | D9 | D8 | D7 | D6 | D5 | D4 | D3 | D2 | D1 | D0 |
|---|---|---|---|---|---|---|---|---|---|---|---|---|---|---|---|
| MUTE | X | X | Gx4 | Gx3 | Gx2 | Gx1 | Gx0 | X | X | X | Gx4 | Gx3 | Gx2 | Gx1 | Gx0 |

FIG. 4E

GENERAL PURPOSE REGISTER (INDEX 20h)

| D15 | D14 | D13 | D12 | D11 | D10 | D9 | D8 | D7 | D6 | D5 | D4 | D3 | D2 | D1 | D0 |
|---|---|---|---|---|---|---|---|---|---|---|---|---|---|---|---|
| 0 | 0 | 0 | 0 | 0 | 0 | MIX | MS | LPBK | 0 | 0 | 0 | 0 | 0 | 0 | 0 |

FIG. 4G

POWERDOWN CONTROL/STATUS REGISTER (INDEX 26h)

| D15 | D14 | D13 | D12 | D11 | D10 | D9 | D8 | D7 | D6 | D5 | D4 | D3 | D2 | D1 | D0 |
|---|---|---|---|---|---|---|---|---|---|---|---|---|---|---|---|
| 0 | PR6 | PR5 | PR4 | PR3 | PR2 | PR1 | PR0 | 0 | 0 | 0 | 0 | REF | ANL | DAC | ADC |

FIG. 4H

TEST CONTROL REGISTER (INDEX 5Ch)

| D15 | D14 | D13 | D12 | D11 | D10 | D9 | D8 | D7 | D6 | D5 | D4 | D3 | D2 | D1 | D0 |
|---|---|---|---|---|---|---|---|---|---|---|---|---|---|---|---|
| 0 | 0 | 0 | 0 | 0 | 0 | 0 | 0 | 0 | 0 | 0 | 0 | T3 | T2 | T1 | T0 |

FIG. 4I

ADC/DAC CALIBRATION ADRESS REGISTER (INDEX 76h)

| D15 | D14 | D13 | D12 | D11 | D10 | D9 | D8 | D7 | D6 | D5 | D4 | D3 | D2 | D1 | D0 |
|---|---|---|---|---|---|---|---|---|---|---|---|---|---|---|---|
| WEA | 0 | 0 | 0 | 0 | 0 | A1 | A0 | WED | 0 | 0 | 0 | 0 | 0 | D1 | D0 |

FIG. 4J

ADC CALIBRATION DATA REGISTER (INDEX 78h)

| D15 | D14 | D13 | D12 | D11 | D10 | D9 | D8 | D7 | D6 | D5 | D4 | D3 | D2 | D1 | D0 |
|---|---|---|---|---|---|---|---|---|---|---|---|---|---|---|---|
| D15 | D14 | D13 | D12 | D11 | D10 | D9 | D8 | D7 | D6 | D5 | D4 | D3 | D2 | D1 | D0 |

FIG. 4K

DAC CALIBRATION DATA REGISTER (INDEX 7Ah)

| D15 | D14 | D13 | D12 | D11 | D10 | D9 | D8 | D7 | D6 | D5 | D4 | D3 | D2 | D1 | D0 |
|---|---|---|---|---|---|---|---|---|---|---|---|---|---|---|---|
| D15 | D14 | D13 | D12 | D11 | D10 | D9 | D8 | D7 | D6 | D5 | D4 | D3 | D2 | D1 | D0 |

MULTIPLE STAGE ATTENUATOR

CROSS REFERENCE TO RELATED APPLICATIONS

This is a division of application Ser. No. 08/833,185, filed Apr. 4, 1997, Now U.S. Pat. No. 6,259,957 entitled CIRCUITS AND METHODS FOR IMPLEMENTING AUDIO CODECS AND SYSTEMS USING THE SAME by Alexander, et al., Inventors, currently pending; and Continuation application Ser. No. 09/631,924, filed Aug. 3, 2000, entitled CIRCUITS AND METHODS FOR IMPLEMENTING AUDIO CODECS AND SYSTEM USING THE SAME, by Alexander, et al., Inventors, currently pending.

BACKGROUND OF THE INVENTION

1. Field of the Invention

The present invention relates in general to digital data processing and in particular to circuits and methods for implementing audio Codecs and systems using the same.

2. Description of the Related Art

The ability to process audio information has become increasingly important in the personal computer (PC) environment. Among other things, audio is important in many multimedia applications, such as gaming and telecommunications. Audio functionality is therefore typically available on most conventional PCs, either in the form of an add-on audio board or as a standard feature provided on the motherboard itself. In fact, PC users increasingly expect not only audio functionality but high quality sound capability.

One of the key components in most digital audio information processing systems is the Codec (coder-decoder) unit. Among other things, the Codec converts input analog audio information into a digital format for processing by a companion digital audio processor. The digital processor for example may support sample rate conversion, SoundBlaster compatibility, wavetable synthesis, or DirectSound acceleration, among other things. The Codec also converts outgoing signals from the audio processor from digital to analog format for eventual audible output to the user. The Codec may also mix analog and/or digital audio streams.

Thus, to meet the demands of increasingly sophisticated computer users, the need has arisen for new circuits and methods for implementing audio Codecs, and systems using the same. Among other things, such circuits and methods should provide for the implementation of Codecs for use with high quality sound systems and should support such features as stereo full-duplex coding/decoding, CD differential input, mono microphone input, and headphone output.

SUMMARY OF THE INVENTION

Audio data processing circuitry is disclosed which includes a plurality of analog inputs for receiving analog audio data and a digital input for receiving digital audio data. A first analog mixer is provided for mixing analog data received from the analog inputs to generate a mixed analog audio stream. An analog to digital converter converts the mixed analog audio stream to a digital audio stream. A digital mixer mixes the digital data received at the digital input with the digital audio stream from the analog mixer to generate a mixed digital audio stream.

The principles of the present invention substantially meet the demand of increasingly sophisticated computer users for audio subsystems which produce high quality sound. Additionally, the application of the principles of the present invention allows for the provision of such features as stereo full-duplex coding/decoding, CD differential input, mono microphone input, a headphone output, as well as digital connections to a companion audio controller, as desired.

BRIEF DESCRIPTION OF THE DRAWINGS

For a more complete understanding of the present invention, and the advantages thereof, reference is now made to the following descriptions taken in conjunction with the accompanying drawings, in which:

FIG. 4A is a diagram illustrating the bit fields of the Master Volume Control Register;

FIG. 4B illustrated the bit fields of the Alternate Volume Control Register;

FIG. 4C is a diagram representing the bit fields of the Master Mono Volume Control Register;

FIG. 4D is a diagram of the PC_BEEP Volume control register;

FIG. 4E illustrates the Analog Mixer Input Gain Registers (Phone Volume, Mic Volume, Line-in Volume, CD Volume, Video Volume, Aux Volume, PCM Out Volume);

FIG. 4G is a diagram of the General Purpose Register (Index 20h), the defined bits of which are the MIX, MS, and LPBK bits;

FIG. 4H is a diagram illustrating the bit fields of the Powerdown Control/Status Register;

FIG. 4I is a diagram illustrating the bit fields of the Test Control Register;

FIG. 4J is a diagram of the ADC/DAC Calibration Address Register;

FIG. 4K is a diagram generally describing the bit fields of ADC Calibration Data Register, which is a vendor reserved readable/writable register used to provide access to the ADC Calibration Registers;

DESCRIPTION OF THE PREFERRED EMBODIMENTS

The principles of the present invention and their advantages are best understood by referring to the illustrated embodiment depicted in FIGS. 1–8 of the drawings, in which like numbers designate like parts.

Figure 1A:
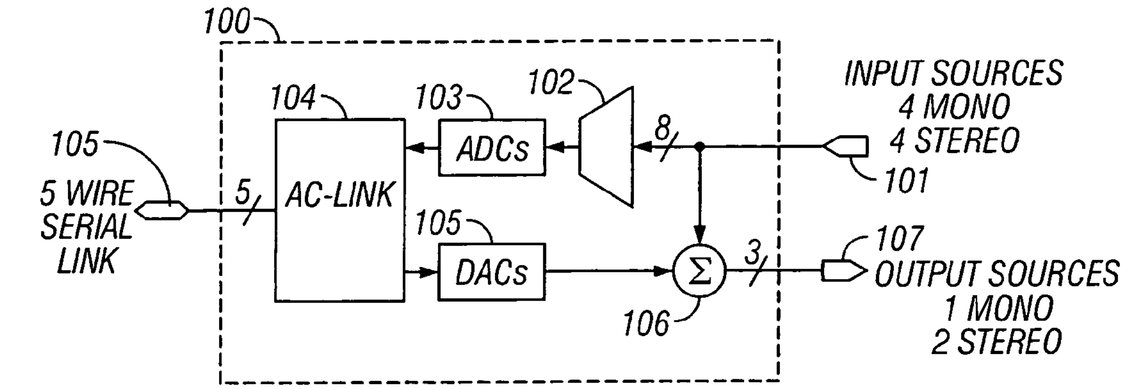
FIG. 1A is a diagram of the major components of a mixed-signal serial Codec according to the principles of the present invention.

FIG. 1A is a diagram of the major components of a mixed-signal serial Codec 100 according to the principles of the present invention. As discussed further below, when used in a system including a digital audio accelerator (controller), Codec 100 mixes analog data streams received from system-external sources and digital data streams received from the controller. In addition to embodying the principles of the present invention, Codec 100 is also compliant with the Intel AC '97 specification, revision 1.03, Sep. 15, 1996, incorporated herein by reference.

As shown in FIG. 1A, Codec 100 includes input port 101 for receiving data from 4 mono and 4 stereo analog input sources. Input multiplexer 102 selectively presents one of the analog inputs received at input port 101 to analog to digital converters (ADCs) 103. After conversion of the selected data stream from analog to a digital format, that data is passed on to an audio Codec (AC) Link driver 104.

AC-Link 104 allows Codec 100 to communicate with the companion digital controller via a 5-wire serial link 105. In accordance with the AC '97 specification serial link 105 consists of 2 clock lines, 2 data lines, and a reset line.

The output path of a Codec 100 includes digital analog converters 106, for transforming the digital data processed by AC-Link 104 into an analog format, and an output mixer 106. Output mixer 106 presents to the output port 107 a stereo output, on two lines, and a mono output on a single line. Signals output from output port 107 can then be recorded or delivered to audio components (amplifiers, speakers, . . . ) for audible presentation to the user.

Figure 1B:
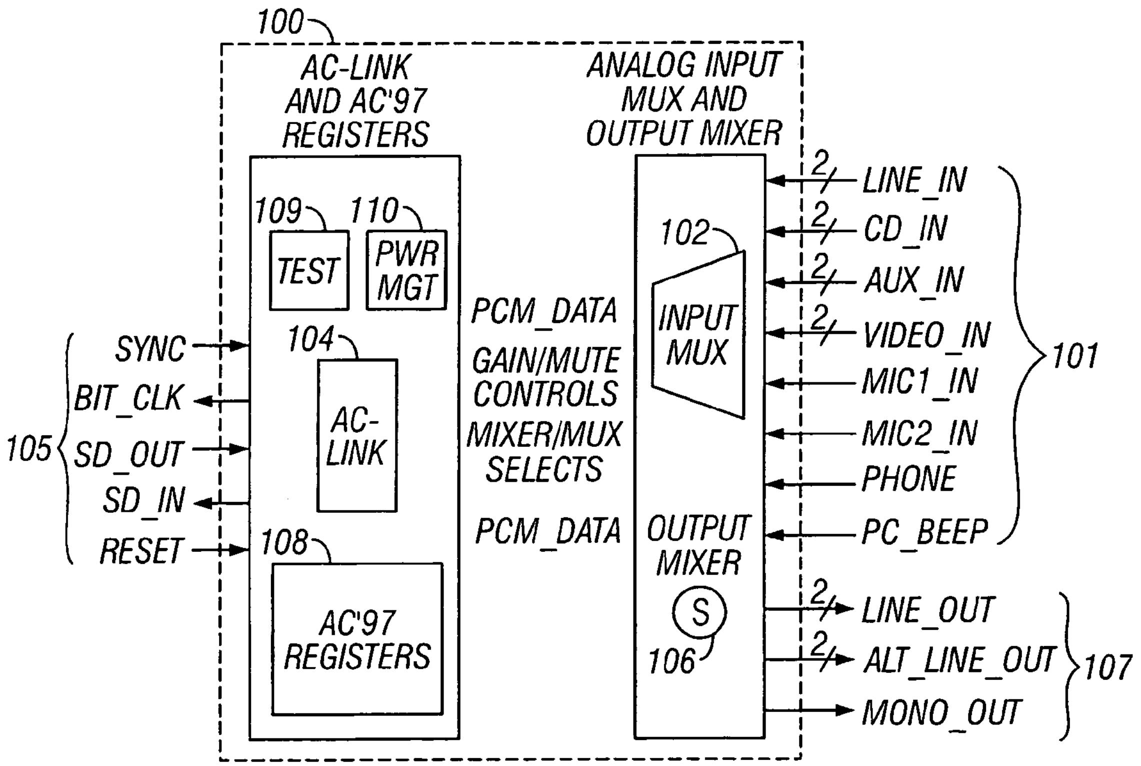
FIG. 1B is a more detailed overview diagram of the Codec of FIG. 1A, which includes individual definitions of the inputs and outputs.

FIG. 1B is a more detailed overview diagram of Codec 100, which includes individual definitions of the inputs into input port 101, lines 5-wire serial link 105, and the outputs from output port 107. Further, FIG. 1B depicts selected internal data and control signals pertinent to the present discussion. FIG. 1B also generally shows the AC '97 registers 108, internal test circuitry 109 and power management circuitry 110.

As shown in FIG. 1A, the input port 101 is comprised of 8 individual inputs, 4 single line (pin) inputs for receiving mono source information and 4 two line (pin) inputs for receiving stereo source information. The specific signals include LINE_IN, AUX_IN, VIDEO_IN, MIC1_IN, MIC2_IN, PHONE, and PC_BEEP.

The LINE_IN pair of inputs provide for the input of left and right stereo analog data. The two AUX_IN inputs provide left and right channel stereo analog auxiliary source input. The pair of inputs CD_IN are used for the input of left and right channel CD audio analog data. The input pair labelled VIDEO_IN are provided for inputting left and right channel stereo analog audio signal inputs from a video device. Each of these inputs pairs are nominally $1V_{RMS}$, internally biased at the $V_{REFOUT}$ voltage reference, and normally are AC coupled to the auxiliary analog source.

Inputs MIC1_IN and MIC2 _IN are multiplexed inputs each of which can dependently be used as a monophonic analog input source to output mixer 106. The selected input also provided to the input mixer. These lines are provided as alternate microphone connections with the input nominally at $1V_{RMS}$, internally biased at the $V_{REFOUT}$ voltage reference, and are normally AC coupled to the respective input source.

The PHONE single-pin input provides for the input of data from a voice modem. The PHONE input is not coupled to the stereo to mono mixer. This input is nominally $1V_{RMS}$ internally biased at the $V_{REFOUT}$ voltage reference and is normally AC coupled to the external source circuitry.

The input (single-pin) labeled PC_BEEP provides a PC_BEEP connection to Codec 100. This input is also not coupled to the stereo to mono mixer. The input voltage is nominally $1V_{RMS}$ internally biased at the $V_{REFOUT}$ voltage reference and is AC coupled to the appropriate source circuitry.

Figure 2A:
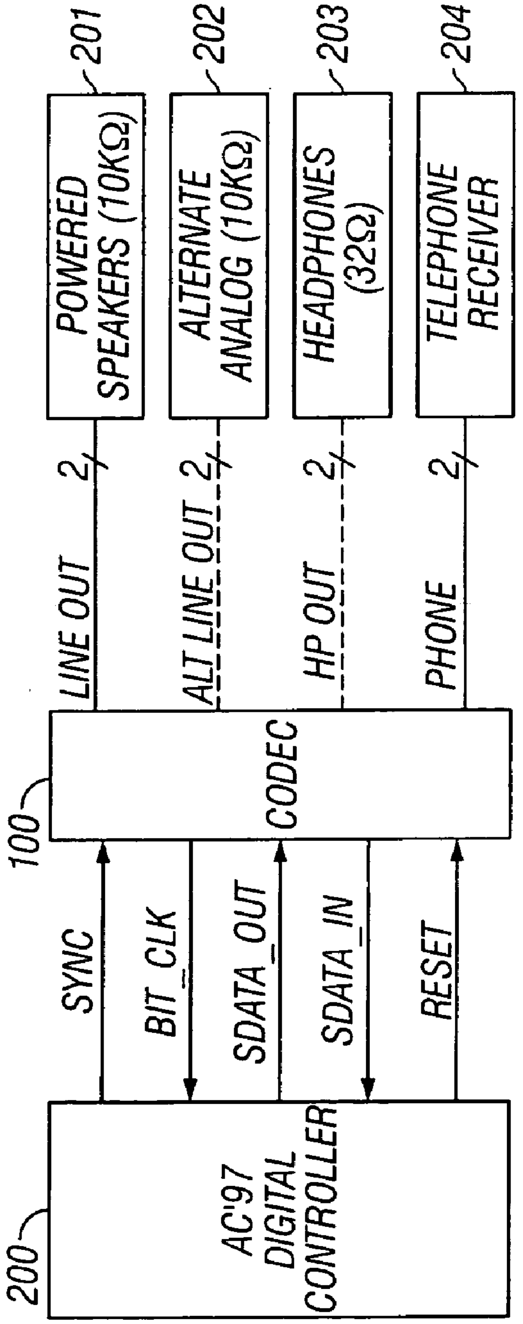
FIG. 2A depicts the AC link connections between Codec and a digital AC '97 controller.
Figure 2B:
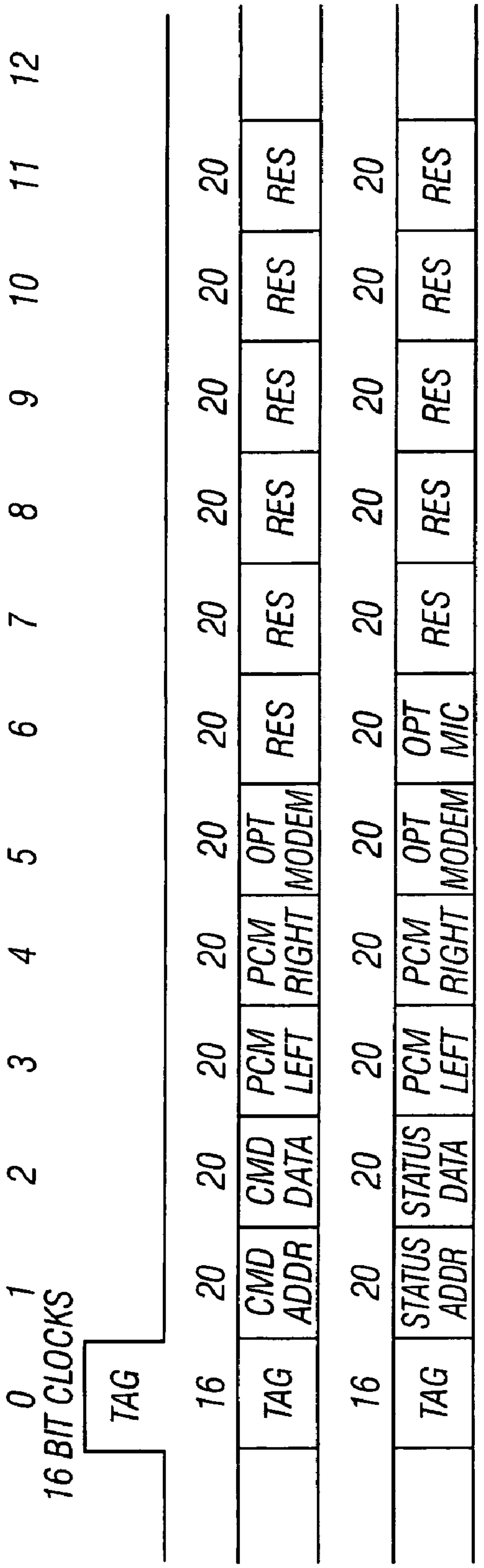
FIG. 2B is a diagram illustrating the protocol for exchanging information between the Codec and controller depicted in FIG. 2B.

5-Wire AC link 105 provides for the input of the synchronization (SYNC), data from the controller (SD_OUT) and reset signals, and for the output of link clock (BIT_CLK) and data to the controller (SD_IN), as required to interface Codec 100 with digital AC '97 controller. FIG. 2A depicts the AC link connections between Codec 100 and a digital AC '97 controller 200. Controller 200 could be any controller conforming to the Intel AC '97 specification. For example, controller 200 may be a Crystal Semiconductor CS-4610 device configured as an AC '97 controller. Such a device is described in detail in co-pending and co-assigned U.S. patent application Ser. No. 08/797,232, entitled "Circuit, Systems and Methods for Processing Multiple Data Streams," filed Feb. 7, 1997.

BIT_CLK is the main clock which defines the protocol used on link 105. This clock is generated by Codec 100 by dividing in half a 24.576 megahertz signal received from an external crystal (not shown) to obtain a 12.288 megahertz clock BIT_CLK. The BIT_CLK signal has a duty cycle between 40% and 60% and is used by controller 200 to synchronize signals SYNC and SDATA_OUT passed back to Codec 100.

The signal SYNC is generated by controller 100 and presented to Codec 100 to define the beginning of a data frame. SYNC is a 48-khertz clock generated by dividing BIT_CLK by 256. The logic high period of this signal is defined to be equal to 16 periods of BIT_CLK (approximately 1.3 microseconds) and is synchronous to the rising edge of BIT_CLK.

The signal SDATA_OUT (serial output data) is generated by controller 100 and input to Codec 100. In particular, this data is positioned by controller 200 on the rising edge of BIT_CLK and Codec 100 samples this data on the falling edge of BIT_CLK.

SDATA_IN is used by controller 200 to receive serial data and status information from Codec 100. Specifically, Codec 100 positions data on the SDATA_IN line on the rising edge of BIT_CLK and controller 200 samples of the signal transferred on this line on the falling edge of BIT_CLK.

Reset signal RESET is generated by controller 200 and forces Codec 100 into a power-on type initialization. In particular, in the active state, reset is held low for a minimum of 1 microsecond. Once RESET transitions to a logic high state, Codec 100 enters a normal mode of operation after a start-up delay to power-up the reference voltages and calibrate the internal blocks.

Output port 107 includes an output pair LINE_OUT, ALT_LINE_OUT output pair and a single MONO_OUT line. The pair of outputs LINE_OUT are the left and right channel stereo outputs from output mixer 106. These outputs are nominally $1V_{RMS}$ internally biased at the $V_{REFOUT}$ voltage reference and are normally AC coupled to external circuitry. Typically, a 1000 pF NPO Capacitor couples these outputs (pins) to analog ground.

The pair of outputs labeled ALT_LINE_OUT are the right and left channel alternate analog (headphones) outputs from output mixer 106. These outputs are also nominally $1V_{RMS}$ internally biased at the $V_{REFOUT}$ voltage reference, are normally AC coupled to the appropriate external circuitry, and are coupled to analog ground through a 100 pF NPO Capacitor.

The output labeled MONO_OUT is a single line (pin) monophonic output from output mixer 106 at $1V_{RMS}$ internally biased at the $V_{REFOUT}$ voltage reference. This output (pin) is normally AC coupled to external circuitry.

In sum, the primary output (LINE_OUT) is available to drive a stereo audio device, such as powered speakers 201 on similar 10 KΩ audio loads. In embodiments having an alternate output (ALT_LINE_OUT), capability is provided to provide connection to additional stereo 10 KΩ audio devices or simply an optional stereo output. In alternate embodiments having instead a HP_OUT output, capability is provided to drive a set of stereo headphones or similar 32 Ω audio component. Finally, the PHONE output is provided to transfer data to a telephonic speakerphone, handset or headset.

During each audio frame, data is passed both to Codec 100 from controller 200 (the "output cycle") and to controller 200 from Codec 100 (the "input cycle"). The output and input cycles are generally illustrated in the conceptual timing diagram of FIG. 2B. It should be noted that in this diagram, the timing relationships are only generally illustrated for brevity and clarity. For example, the actual number of BIT_CLK periods between the rising and falling transitions of each slot will vary in actual applications, depending on the width of the slot.

The SDATA_OUT signal in FIG. 2C represents the data being transferred from controller 200 to Codec 100 during the output cycle. When SYNC transitions active (logic high) and is sampled as active by Codec 100 on the falling edge of BIT_CLK, both Codec 100 and controller 200 are synchronized to a new audio data frame. The data on the SDATA_OUT pin at this falling edge of the bit clock is the final bit data of the previous audio frame. On the next rising edge of BIT_CLK, the first bit of slot 0 is sent to Codec 100.

The first slot of SDATA_OUT (slot 0) is a 16-bit (tag) slot which contains information about the validity of data for the remaining 12 slots. The first bit in slot 0 (bit 15) is the 'Valid Frame' bit. This bit indicates if any of the following slots (slots 1–11) contains valid data. If this bit is a '1', at least one of the other 12 slots contains valid data. If this bit is a '0', the remainder of the frame can be ignored.

The next four bits of slot 0 (bits 11–14) are 'Slot Valid' bits. Bits 14–11 correspond to slots 1–4 respectively. If any of these bits is a 1, the corresponding slot contains valid data during the frame. Slot 0 bits 10–0 are reserved.

The data presented to SDATA_OUT pin is shifted out MSB justified, with the most significant bit of the actual data in the MSB position of each 20-bit slot. In any case where there is less than 20-bits of valid data for a given slot (e.g. 18-bit PCM data in a 20-bit slot), the trailing (least significant) bit positions of the slot are filled with logic 0s by controller 100. For the reserved slots, the bit positions are normally all filled with logic 0s.

TABLE 1 defines the audio output frame slots. Slot 0 is the Tag Control Register. It is the 16-bit slot which determines validity of all other slots, as described above. Slots 1 and 2 are used as a "command port" for accessing the mixer registers discussed later. Generally, there are 64 defined 16-bit registers which may be accessed through the 20 bits of Slot 1 as described in TABLE 2.

Bit 19 of Slot 1 is a Read/Write bit. When this bit is a 1, the transaction is to be a read. When the bit is a 0, a write will occur. In both cases, register accesses only occur when the Slot Valid bit corresponding to Slot 1(bit 14 of slot 0) is active.

Bits 18–12 of Slot 1 contain a 7-bit register index. All registers are defined to exist at even-byte addressable boundaries (implying bit 12 would always be '0'), however this cannot be assumed; Bit 12 is simply ignored, and not assumed to be either a '0'or '1'. Bit positions 11-0 are reserved and are filled with logic 0s from the controller 200.

Slot 2 is the Command Data Port for each frame of SDATA_OUT. This slot is used to write data to the mixer registers. The most significant 16 bits of the slot (bits 19–4) contain a new 16-bit value to be written to the selected register. Bits 3–0 are ignored, but always contain 0s. For any write to a Mixer register, the write is considered to be an 'atomic' access. In other words, when the Slot Valid bit for Slot 1 is set, the Slot Valid bit for slot 2 should always be set during the same audio frame. This guarantees that no write access will be split across 2 frames. If the access defined in Slot 1 is a read, Slot 2 is completely ignored.

Slots 3 and 4 contain the digital audio (PCM) left and right channel playback streams; Slot 3 contains the left channel data, and Slot 4 contains the right channel data. In Codec 100, the pulse code modulated (PCM) playback data will be taken from the most significant 18 bits of Slot 3 and Slot 4, and the least significant 2 bit positions of these slots are ignored.

Slots 5–11 are reserved and the contents of their bit positions are ignored, although 0s are preferably written thereto by controller 100.

During an audio input cycle, data is transmitted from Codec 100 output SDATA_IN to controller 200. The format for the input cycles, as illustrated in FIG. 3, is similar to that of the output cycles. Synchronization of Codec 100 and controller 200 is performed in the same manner, and the frame is again divided into 12 20-bit slots plus a single 16-bit Tag slot.

The first slot in the input cycle (Slot 0) serves two purposes. The most significant bit (Bit 15) is the 'Codec Ready' bit. This bit indicates the readiness of AC-Link 104 and the AC '97 Control and Status Registers. Immediately after a cold or power-on reset (discussed below) the Codec Ready bit is returned to controller 100 as a logic 0 and once the Codec clocks and voltages are stable, is transitioned to a '1'.

Bits 14–11 of Slot 0 are defined as 'Slot Valid' bits corresponding to the four data slots (Slots 3–6). When any of these Slot 0 bits are returned to controller 200 as a logic 1, the corresponding slot contains valid data. The remaining bits of slot 0 (bits 10–0) always return a logic '0' as they are reserved/undefined.

The audio input frame slot definitions are generally provided in TABLE 3. Slot 0, as described above, contains the 'Codec Ready' bits and 4 'Slot Ready' bits. Slot 1 is the Status Address Port. The Status Address Port allows controller 200 to access status and register data, including data in the mixer registers, from Codec 100. TABLE 4 defines the status address port bits of Slot 1.

The valid bits for Slot 1 are bits 18–12 which identify the index address of the register within registers 108 corresponding to the data being returned to the Status Data Port (Slot 2). All read operations are considered 'atomic' accesses. Therefore, the address of the register is returned in Slot 1 with the Slot 1 Valid bit set whenever read data are returned in Slot 2 with the Slot 2 Valid bit set.

Slot 2 is the "Status Data Port." Since all Mixer registers are 16-bits wide, the upper 16 bits (bits 19–4) of Slot 2 contain the contents of the register which was read in accordance with Slot 1, and the lower 4 bits contain 0's. When Codec 100 is ready to return data through this port, slot 0, bit 13 is set to 1. Data will be returned from a read access on the frame following the read request in all cases.

Slot 3 and Slot 4 are the PCM Record Data slots. Codec 100 is a 18-bit Codec, and therefore will output to controller 200 18-bit PCM data in the most significant 18 bit positions (bits 19–2) of the PCM Record slots. Bits 1–0 of both slots will always contain 0's. Slot 3 corresponds to the Left Channel data, while Slot 4 corresponds to the Right Channel data.

Slots 5–11 of each frame of SDATA_IN are reserved/undefined, and therefore will always return 0's for all bits. Slot 5 could be assigned to carry modem data when an optional modem is used and Slot 6 could be used to carry optional microphone data, when a direct microphone connection is provided (FIGS. 3A and 3B).

Figure 3A:
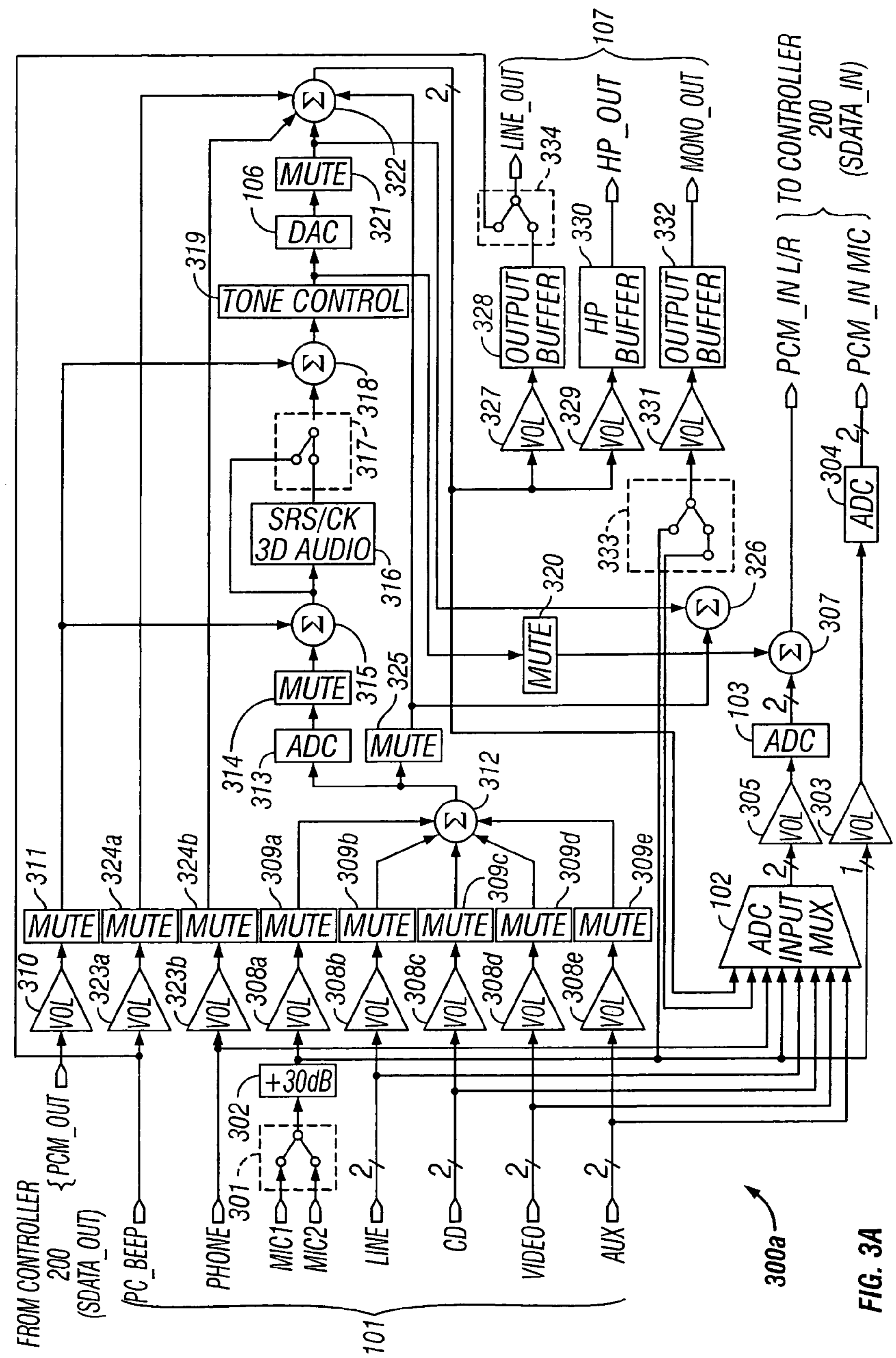
FIG. 3A is a more detailed diagram of a first embodiment of the mixer 300 of Codec 100 and the output and input cycles are generally illustrated in the conceptual timing diagram.
Figure 3B:
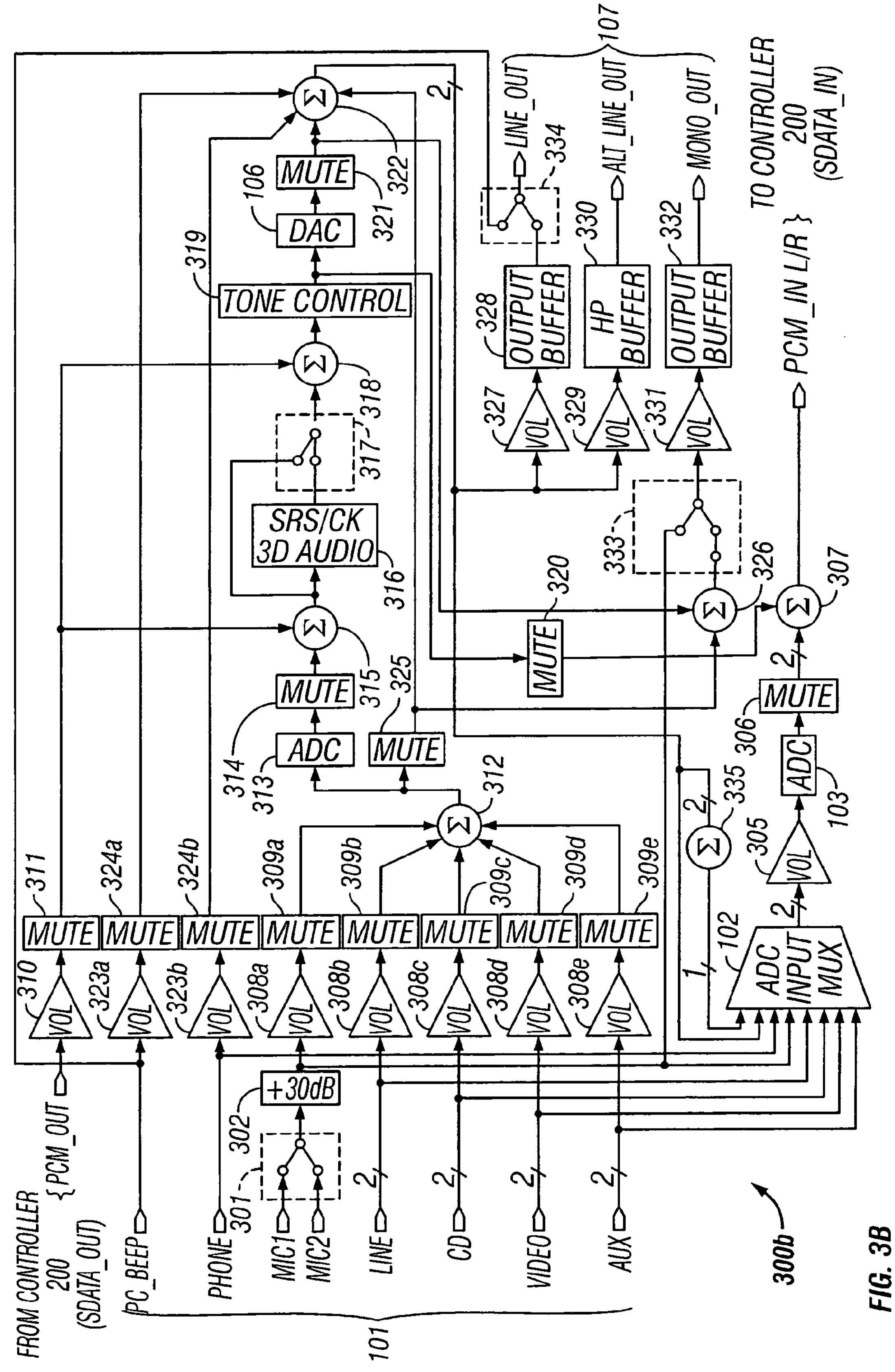
FIG. 3B is an alternate embodiment 300B of the mixer section of Codec 100.

FIG. 3A is a more detailed diagram of a first embodiment of the mixer 300A of Codec 100. The individual components/subsystems are controlled by the contents of corresponding registers within register 108, as discussed further below. A design of the digital portions of Codec 100 and in particular the digital components of the system of FIG. 3 is provided in Appendix A. The data provided in Appendix A is the Cadence Verilog hardware description language now in the art, and may be executed on a Sun Microsystems (SPARC) workstation.

Codec 100 includes multiple processing paths for mixing and converting data being exchanged between controller 200 and external analog audio devices. Each of these will be discussed in detail; however, the Codec 100 data paths can generally be described as follows. During the input of data to controller 200, selector 102 selects one stream from among a set of streams including the unmixed input analog streams (MIC1 or MIC2, LINE_IN, CD, VIDEO and AUX_IN) and a mixed stream generated by mixing these analog streams together and/or with PCM data returned from controller 200. The selected stream, in digital format, is transmitted to controller 200 via the SDATA_IN line of link 105. During the output of data streams from controller 200 to external audio devices, PCM data from controller 200 is selectively mixed with the audio input streams (MIC1 or MIC2, LINE_IN, CD, VIDEO and AUX_IN), converted into analog format, and output to the given external audio devices via the LINE_OUT, MONO_OUT or ALT_LINE_OUT pins. Codec 100 further includes a number of other selectable paths for processing flexibility, including paths for specifically processing data received through the PC_BEEP and PHONE analog inputs.

In one input path, MIC1 or MIC2, LINE, CD, VIDEO and/or AUX input data presented at input 101 are passed to input multiplexer 102 directly. Specifically, a switch 301 allows the user to select for input between data generated by microphone 1 (MIC1) or microphone 2 (MIC2). The selected microphone input is then amplified by amplifier 302 by approximately +20 dB. The microphone analog data output from amplifier 302 is presented not only to the input of input multiplexer 102, but also through an amplifier 303 and a dedicated microphone analog-to-digital converter 304. The direct data path through amplifier 303 and ADC 304, when used allows the transmission of PCM microphone data to controller 200 via the SDATA_IN line using one of the reserved frame slots. The digitized (PCM) microphone input data from analog-to-digital converter 304 is then sent to controller 200 via the SDATA_IN link using a selected one of reserved slots in each frame, such as Slot 6.

The remaining signals, LINE, CD, VIDEO and/or AUX are provided directly to multiplexer 102. Multiplexer 102 can thus select directly from any one of the signals presented at input 101. Input multiplexer 102 has independent control of the left and right channels which advantageously facilitates returning a mono mix of the stereo line channel and/or echo cancellation on the microphone source by controller 200. In addition to selecting any one of the five analog input sources, such as MIC, CD, LINE_IN, VIDEO, or AUX, presented at inputs 101, multiplexer 102 can also select from the stereo output mix or mono output mix discussed further below.

Figure 3C:
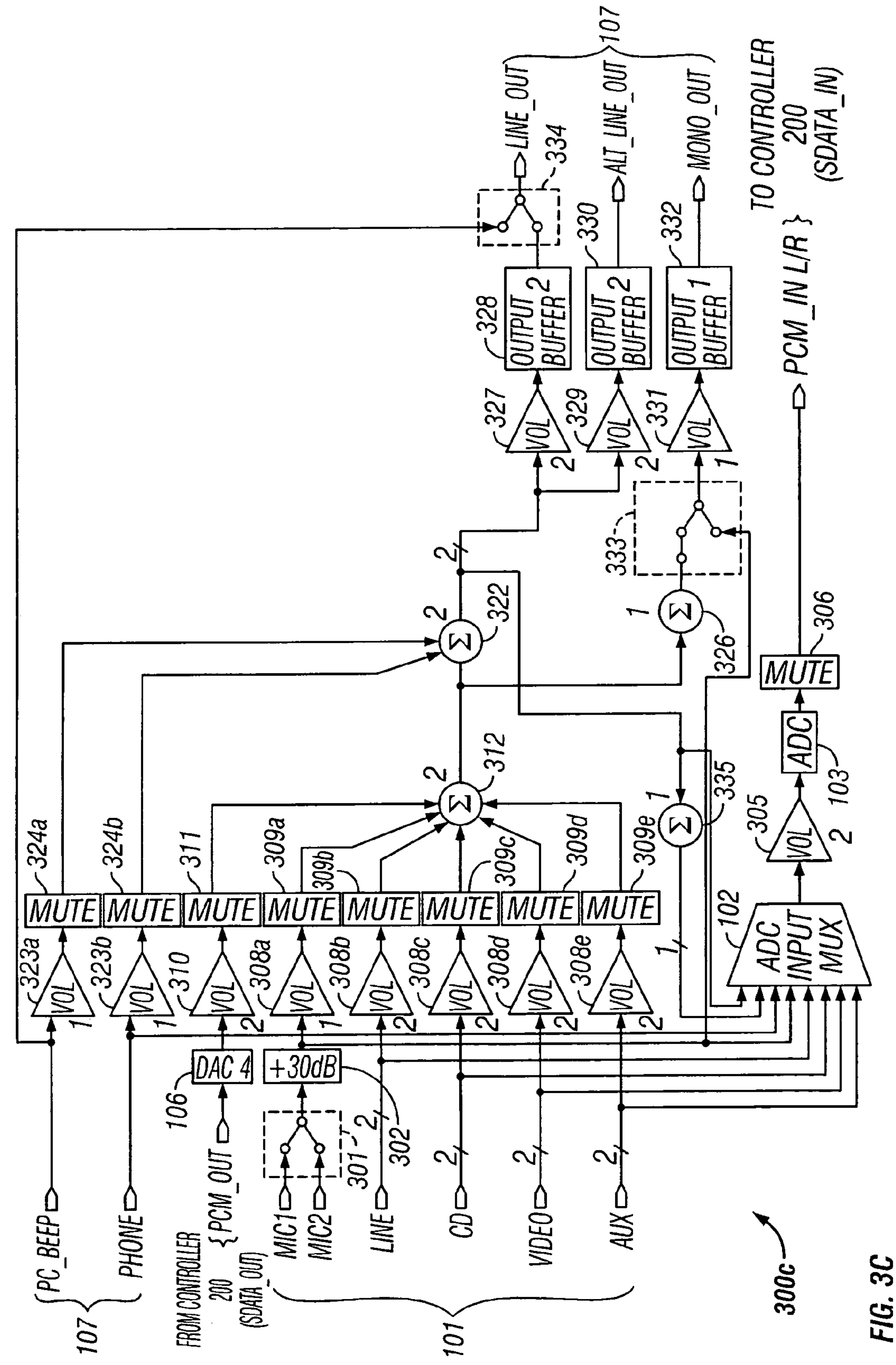
FIG. 3C depicts another embodiment 300C of the mixer section of Codec 100.

The input stream selected by input multiplexer 102 is amplified by amplifier 305 which in turn drives main analog analog-to-digital converters 103. Each analog to digital converter (ADC) discussed herein is generally a delta-sigma ($\Delta\Sigma$) converter. After analog-to-digital conversion, the two-line stereo input stream is passed through mute control circuitry 306 and on to digital mixer 307. It should be noted that each of the digital mixers shown in FIGS. 3A–3C are digital adders with saturation to prevent wrap around. Mixer 307 is provided to mix the input signals selected by multiplexer 102 with mixed digital stereo data tapped from the stereo mixing section. The PCM formatted digital data output from digital mixer 307 is transmitted to controller 200 via AC' 97 link 105 on Slots 3 and 4 of the SDATA_IN stream.

The data received from the stereo mixing section by digital mixer 307 results from the mixing of PCM data received through the SDATA_OUT line of AC' 97 link 105 with the MIC1 or MIC2, LINE, CD, VIDEO, and AUX inputs of input port 101. Specifically, the analog input signals are input through corresponding volume controls 308*a*–308*e* and mute controls 309*a*–309*e*. Generally each input volume/mute controls to Codec 100 are active tapped alternators with zero crossing detection for volume control update. Volume controls 308 and mute controls 309 are controlled by setting bits in the mixer registers discussed below. Similarly, the PCM data from controller 200 is input through volume controls 310 and mute controls 311, each of which is also controlled by bits written into the mixer registers. The analog inputs MIC1 or MIC2, LINE, CD, VIDEO, AUX are then mixed by an analog stereo effect mixer 312 before conversion to digital format by effects path A-D converter 313. Each of the analog mixers depicted in FIGS. 3A–3C are active resistor summers. Additional mute controls 314 are provided at the output of analog-to-digital converter 313.

A digital mixer 315 selectively mixes the outputs of analog-to-digital converter 313 with the digital data (serially left and right channel data from Slots 3 and 4 of SDATA_OUT) received from controller 200 through volume control 310 and mute control 311. If mixing of PCM data with the mixed and converted analog data from the analog inputs is not desired before 3-D processing, only the converted analog input data is passed through mixer 315. The digital mixed signal output from mixer 315 can optionally undergo 3-D audio processing by 3-D audio circuitry 316 or can bypass 3-D processing circuitry 316 through switch 317. 3-D digital audio circuitry 316 performs such processing as volume control, reverb, pan, Doppler, HRTF or similar audio enhancement options under industry available protocols, such as SRSQX.

Another digital mixer 318 provides an optional path for mixing received data from controller 200 with the data input from inputs 101. In this case, the mixing of the data originally input as analog at inputs 101 is mixed with the digital data direct from controller 200 after optional 3-D processing by 3-D processing circuitry 316. In other words, 3-D processing for the PCM data can be selectively foregone, notwithstanding the fact that 3-D processing is performed on the converted analog input data. The output of mixer at 318 is then provided to tone controls 319. Tone controls when provided, provide for adjustment of the bass and treble components, for example in 1.5 dB or 3 dB steps. The two-channel output of tone controls 319 are passed through mute controls 320 and directly therefrom to digital mixer 307.

The two-channel output of tone control 319 is also provided to main digital-to-analog converter 106. The digital to analog converters (DACs) of Codec 100 may be for example a delta-sigma converter. Analog output from main digital-to-analog converter 106 is passed through mute controls 321 and on to analog stereo output mixer 322. Analog stereo output mixer 322 mixes the analog signal output from main digital-to-analog converter 106 with the PC_BEEP and PHONE inputs received from input port 101 (through volume controls 323*a*–323*b* and mute controls 324*a*–324*b*). Mixer 322 can also receive analog data directly from analog effects mixer 312 through a 90 dB analog bypass path. In particular, the analog bypass path takes analog data directly from analog stereo effects mixer 312, passes them through mute controls 325 and directly on to analog input mixer 322.

Mixed analog output data from analog mixer 322 provides a further input to input multiplexer 102. Most importantly, the output of analog stereo output mixer 322 passed to the LINE_OUT and HP_OUT outputs of Codec 100 output port 107 for transmission to external audio devices. The LINE_OUT output is driven by master volume control 327 and output buffer 328 while the HP_OUT output is driven by headphone volume control 329 and headphone driver 330. For the embodiment of FIG. 3A, the LINE_OUT designed to drive a load of approximately 10 KΩ and the HP_OUT designed to drive a load of approximately 32 Ω

The mono output (MONO_OUT) is not directly generated from analog stereo mixer 322. Instead, a mono output mixer 326 mixes in the PC_BEEP and PHONE sources with the PCM and analog sources. This scheme is advantageous, for example, because the mono mix from the mono output port may be used to drive a phone handset. Mixing the phone input back into the handset may cause echoes at the other end of the phone line. Therefore, the mono mix is taken from the analog input mixer 312 through the analog bypass, which does not include the PC_BEEP or PHONE source signals. The MONO_OUT port is designed to drive an approximately 10K load.

FIG. 3B is an alternate embodiment 300*b* of the mixer section of Codec 100. In this embodiment, the direct microphone path to controller 200 via SDATA_IN comprising volume control 303 and analog-to-digital converter 304 has been eliminated. Additionally, mute controls 306 in the stereo PCM path to controller 200 are not used in this embodiment. Further, the direct connection between mono output mixer 326 and multiplexer 102 has been replaced by a connection from analog output mixer 322 through an additional mixer 335. Mixer 335 takes the left and right stereo output from analog output mixer 322 and mixes those channels to a single mono channel which is passed to multiplexer 102. Additionally, in this embodiment, as well as the embodiment of FIG. 2B, the HP_OUT path has been replaced with a path for driving an approximately 10 KΩ load (i.e. ALT_LINE_OUT) FIG. 3C depicts another embodiment 300*c* of the mixer section of Codec 100. In this embodiment the PCM data from controller 200 is first converted from digital to analog by main digital analog converter 106. The analog data output of D/A converter 106 is mixed with the analog inputs MIC1 or MIC2, LINE, CD, VIDEO, and/or AUX. The analog output of mixer 322 in turn mixes the analog output from mixer 312 with the PHONE and PC_BEEP analog inputs. The output of analog output mixer 322 then directly passed to the volume controls 327 and 329 and output buffers 328 and 330, respectively driving the LINE_OUT and ALT_LINE_OUT outputs of Codec analog output port 107.

The two-channel output of analog stereo output mixer 322 is mixed into single channel mono by mixers 326 and 335, respectively, with mixer 326 providing mono analog data to switch 333 and mixer 335 providing mono analog data to multiplexer 102.

TABLE 5 generally describes registers 108 of Codec 100. These registers include the "mixer registers" for controlling the various functions of mixer section 300, vendor identification registers, the Powerdown/Status register, and a General Purpose register. The bit names in TABLE 5 will be defined in conjunction with the discussion in FIGS. 4A–4L and the individual registers themselves. Bit positions denoted with an 'X' are reserved. As such, writes to these positions are ignored and reads are returned with undefined values. Bit positions denoted with a '0' indicate values which are hard-coded to logic '0' values. Thus, writes will not change the values in these register positions, and they will always read as '0's.

The reset register is shown in TABLE 5 and is located at index 00h. Any write to this register causes a register reset, forcing all Mixer Control Registers to return to their default state. Reads from the Reset Register will return configuration information about Codec 100 identifying any optional features which are supported. For example, in embodiments of Codec 100 which support the 18-bit DAC/ADC as well as the Headphone Output (Alternate Line Out), the read value from this register will be 0150h.

FIG. 4A is a diagram illustrating the bit fields of the Master Volume control register at register index 02h. The Master Volume control register is used to control the LINE_OUT signal volume by master volume controls 327, with each register step corresponding to 1.5 dB volume adjustment across a range of 0 dB to 94.5 dB of attenuation. The most significant bit (MSB) of this register controls a master analog mute for the LINE_OUT output. Bits ML5–ML0 of the register are used to control Left Channel Volume and bits MR5–MR0 are used to control the Right Channel Volume. The default value for the Master Volume control register is 8000h, corresponding to 0 dB attenuation and mute on.

The bit fields of the Alternate Volume control register (Index 04h) are illustrated in FIG. 4B. The Alternate Volume control register is used to control ALT_LINE_OUT signal volume through volume controls 329. Each register step corresponds to 1.5 dB volume adjustment in a range between 0 dB and 94.5 dB of attenuation. The MSB of this register controls a master analog mute for the ALT_LINE_OUT. Bits ML5–ML0 of the register are used to control the Left Channel's volume, and bits MR5–MR0 are used to control the Right Channel's volume. The default value for this register is 8000h, corresponding to 0 dB attenuation and mute on.

FIG. 4C is a diagram representing the bit fields of the Master Mono Volume control register (Index 06h). The Master Mono Volume control register is used to control the MONO_OUT output volume in conjunction with mono volume controls 331. Each register step corresponds to 1.5 dB volume adjustment over a range 0 dB to 94.5 dB of attenuation. The MSB of this register controls a master analog mute for the MONO_OUT output. Bits MM5–MM0 of the register are used to control the actual volume levels. The default value for this register is 8000h, corresponding to 0 dB attenuation and mute on.

A Master Tone control register is included at register index 08h. This register provides for tone adjustment by tone controls 319, when provided.

FIG. 4D is a diagram of the PC_BEEP Volume control register (Index 0Ah). The PC_BEEP Volume control register is used to control the mix of the PC_BEEP signal into Analog Output Mixer 322 by volume controls 323*a* and mute controls 324*a*. Each register step corresponds to 3.0 dB volume adjustment across a range of 0 dB to 45 dB of attenuation. The MSB of this register controls a master analog mute for the PC PEEP and bits PV3–PV0 control the actual volume levels. The 4 data bits PV3–PV0 are not aligned to the least significant bit position of the register. In other words, data bit 0 (PV0) corresponds to bit D1 of the register. The 3 dB steps in volume control with each step of the value (PV3–PV0) differ from all other gain controls, which provide a 1.5 dB precision. The default state of the mute bit (bit D15) is a 'O', meaning that mute is disabled on power-up.

The Analog Mixer Input Gain Registers (Phone Volume, Mic Volume, Line-in Volume, CD Volume, Video Volume, Aux Volume, PCM Out Volume at indices OC-18h, respectively) are illustrated in the diagram of FIG. 4E. These registers control the gain levels of the analog input sources to the Input Mixer 312 by volume controls 308 and 310 and mute controls 309 and 311. Each register step for all registers corresponds to 1.5 dB gain adjustment, thus allowing a range of 12 dB to −34.5 dB of gain. The MSB of these registers control an analog mute for each source to input mixer 312. Bits Gx4–Gx0 of each register are used to control the gain levels of the corresponding source. The gain mapping for these bits is shown in TABLE 6.

Register 0Eh (the Mic Gain Register) has one additional defined bit, bit D6, which is used to enable the 20 dB gain, which is available for either MIC source, through amplifier 302. Specifically, when bit D6 set to a logic '1', 20 dB gain block 302 is enabled. The default values for the mono input source registers (0Ch and 0Eh) are 8008h, corresponding to 0 dB attenuation and mute on. For the stereo source registers (10h through 18h), the default values are 8808h, corresponding to 0 dB attenuation for both channels with mute on.

The Input Mux Select control register (Index 1Ah) is used to direct multiplexer 102 to pass a source signal received at its inputs to main analog to digital converters 103 for recording. As discussed above, multiplexer 102 is allows for independent control of the left and right channels received from each source. Bits SL2–SL0 provide the decode for the left channel input and bits SR2—SR0 provide the decode for the right channel input. The default power-on value for this register is 0000h, selecting the MIC inputs for both channels. A decode of the bits stored in the Input Mux Select control register is given in TABLE 7.

The Record Gain Register (Index 1Ch) controls the input gain of amplifier 305 disposed after input multiplexer 102 and before analog to digital converter 103. The 4 bit value loaded into this register provides a control range of +22.5 dB to 0 dB of gain. The most significant bit of the register controls an analog Mute which mutes the signal prior to ADC 103. TABLE 8 illustrates the possible gain values available. The default value for this register is 8000h, which corresponds to 0 dB gain with mute on.

The Record Gain Mix control register (Index 1Eh) is used to control the gain of amplifier 304 to the MIC PCM input, when used. This register and amplifier 304 function in a manner similar to that of the Record Gain Register discussed above.

FIG. 4G is a diagram of the General Purpose Register (Index 20h), the defined bits of which are the MIX, MS, and LPBK bits. The MIX bit selects which data to send to the Mono Output Path (MONO_OUT). Specifically, a logic '0' passes the output of mixer 326 through switch 333 to MONO_OUT while a logic '1' passes the previously selected MIC signal to the output. The MIC Select bit (MS) determines which of the 2 MIC inputs are passed to the rest of mixer section 300 through switch 301. A '0' selects MIC 1 Input, while a '1' selects MIC 2 Input. Finally, the LPBK bit enables an ADC/DAC Loopback Mode to facilitate performance evaluation of the mixer path.

The 3D Control Register (Index 22h) allows for control of 3D audio processing circuitry, in those embodiments where the 3D feature is provided.

The Modem Rate control register (Index 24h) is provided for user rate control when an optional Modem connection is included.

FIG. 4H is a diagram illustrating the bit fields of the Powerdown Control/Status Register (Index 26h). TABLE 9 generally describes the function of each of the Powerdown Status Bits while TABLE 10 generally describes the function of each of the Powerdown Control Bits. The PR7 and MDM are provided for optional modem features. Specifically, PR7 provides powerdown capability for a Modem processing subsection and the MDM bit indicates whether that Modem subsection of the Mixer is ready upon powerup.

The Reserved Registers (at Indices 28h–58h) are reserved and therefore writes to these registers are ignored and read values from these registers are always 0000h. The Revision and Fab ID Register indicates the revision level of the device as well as the fabrication facility where the part was manufactured. The Vendor ID register indicates the distributer and/or producer of the part.

FIG. 4I is a diagram illustrating the bit fields of the Test Control Register (Index 5Ch). This Vendor Reserved register is used to control Test Mode entry. The test mode bits (bits T3–T0) chose from one of 12 possible test modes available. The discussion below describes the various test modes.

FIG. 4J is a diagram of the ADC/DAC Calibration Address Register (Index 76h). This Vendor Reserved register controls access to the ADC and DAC calibration registers. The upper byte of the calibration address register (bits 15–8) is used to access the ADC Calibration registers, and the lower byte (bits 7–0) is used to access the DAC Calibration registers. This register can be read at any time, but to write new calibration values to the registers requires entry into a vendor specific test mode. To read either bytes of this register, a write is made to the appropriate register index selected from those set forth in TABLES 11 and 12. Specifically, TABLE 11 generally describes the ADC Calibration Register Address Mapping (bits A1–A0) and TABLE 12 generally describes DAC Calibration Register Address Mapping (bits D1–D0). To perform a write, the register index is set along with at least one of two write enable bits WEA and WED. As soon as any access (read or write) occurs to the Calibration Data register, the Write Enable bit associated with that register is cleared to prevent accidental writes. Writes can be performed to both registers during a single access. The default value for this register is 0000h and when read, the unused bits will always return 0's.

FIG. 4K is a diagram generally describing the bit fields of ADC Calibration Data Register (Index 78h), which is a vendor reserved readable/writable register used to provide access to the ADC Calibration Registers. When a valid index is set in the ADC/DAC Calibration Address register discussed above, a read to the ADC Calibration Data Register will return the most significant 16 bits of the 19-bit available bit positions. When Codec 100 is in test mode 0xf (discussed below) and the WEA bit of Register 76h is set, a write will update the selected ADC Calibration Data Register. The write will place the 16-bit value in the upper 16 bits of the ADC Calibration register, and fill the lower 3 bits with zeroes. When WEA is set, any access, read or write, to this register will clear the WEA bit automatically. If the A1–A0 index bits of register 76*h* are set to either '00'or '11', this register will return an undefined value.

Figures 4L, 5:
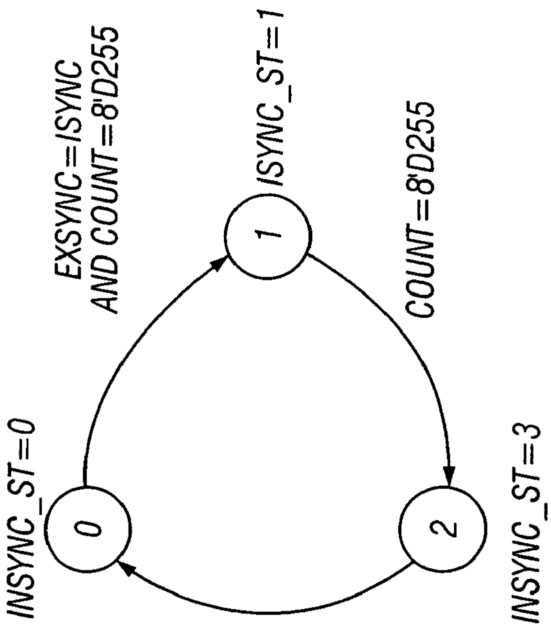
FIG. 4L is a diagram of the bit fields of the DAC Calibration Data Register.
FIG. 5 is diagram illustrating a sequence of operations occurring during start up (cold reset) of the Codec.

FIG. 4L is a diagram of the bit fields of the DAC Calibration Data Register (Index 7Ah). This readable/writable vendor reserved register is used to access the DAC Calibration Registers. When a valid index is set in the ADC/DAC Calibration Address register, a read to the DAC Calibration Data Register will return the most significant 16 bits value of the 19-bit available bit positions. When Codec 100 is in test mode 0xf and the WED bit of Register 76h is set, writes will update the selected DAC Calibration Register. Specifically, the write will place the 16-bit value in the upper 16-bits of the DAC Calibration register, and will fill the lower 3 bits with zeroes. When WED is set, any access, read or write, to this register will clear the WED bit automatically. If the D1–D0 index bits of register 76h are set to either '00'or '11', this register will return an undefined value.

As previously described, the Powerdown Control/Register provides for individual powerdown of different sections of Codec 100. TABLE 13 more particularly describes the bit mapping for the powerdown GPR Bit Functions. Selected functions can also be described as follows.

When, for example, the PRO is set, the ADC bit (bit 0 in register 26h) is cleared to '0' to indicate the ADCs 103 are no longer in a ready state. The same is true for DACs 106/312, Analog Mixers 312/322 and the Reference Voltage (Vref) generator. When the PR bit corresponding to one of the sections of Mixer 300 is cleared back to '0', that section will begin a power-on process, and the corresponding Powerdown Status bit will be set ready ('1') when the hardware is in a ready state.

Assertion of Bit PR4 (logic "1"), causes the AC-Link 105 to turn off the BIT_CLK and drive SDATA_IN to a '0'. The SYNC and SDATA_OUT inputs are ignored by Codec 100. To restore operation to the part from this state, either a cold or a warm reset is required. A cold reset will restore all Mixer registers to their power-on default values. A warm reset will not alter the values of any Mixer register (with the exception of clearing the PR4 bit of register 26h).

Bit PR5 is a 'global powerdown of the Codec' bit. When set, all internal clocks of Codec 100 are shut down. A cold reset is thereafter required to re-establish communications with the Controller 200 since the AC-Link clock is deactivated when Bit $PR_5$ is set.

Codec 100 does not automatically mute any input or output when the powerdown bits are set. The software driver controlling device therefore manages the muting of the input and output analog signals before putting Codec 100 into any power management state. Internal to Codec 100, there are multiple powerdown control signals for various portions of the chip. TABLE 14 generally describes the relationship of each of these signals to the powerdown control bits.

The PDN_DAC is used to powerdown main DACs 106/335. DACs 106/335 can be powered down whenever the Mixer, internal clock, or the DAC powerdown signals are set. The PDN_ADC bit is used to similarly powerdown the ADCs 103 whenever Vref, the internal clocks, or the ADC powerdown bits are set. The PDN_MDC signal is used to powerdown analog mixer 322 whenever the internal clocks or the Mixer powerdown bits are set.

Signal PDN_REF is used to powerdown the internal voltage reference generation (Vref) circuit whenever the Vref or internal clocks powerdown bits are set. PDN_BITCLK disables the external BIT_CLK clock. This occurs whenever the AC-Link or the internal clock powerdown bits are set. PDN_ALT_LINE is used to powerdown the Alternate Line Output buffer 330 whenever analog mixer 322 is powered down, the internal clocks are disabled, or the explicit Headphone Powerdown bit is set. PDN_CLK256_INT stops the internal BIT_CLK (256Fs) clock. This will only occur when the internal clock disable powerdown bit is set PR5).

When no activity is occurring across the link 105, Codec 100 can be operated in a low power mode. Specifically, a Powerdown Control/Status register Index (0x26) of registers 109 bit 12 is set to a logic '1' and link 105 is powered down. Codec 100 drives both BIT_CLK and SDATA_IN to low levels immediately after the write to register and the remainder of the current audio frame is ignored. At the same time, controller 200 drives the SYNC and SDATA_OUT signals to logic low levels. In this state, the data SDATA_OUT is ignored Codec 100 supports 'cold reset' and 'warm reset modes to returning AC '97 link 105 to full power up. A cold reset is performed when Codec 100, including its registers, is initialized to its default state. A warm reset is performed when the contents of the registers of Codec 100 are to remain unaltered.

Controller 200 initiates a cold reset by asserting the RESET# signal. Once controller 200 has deasserted RESET#, all of the registers of Codec 100 will have been reset to a default power-on state and the BIT_CLK and SDATA_IN signals will be reactivated. Additionally, If the PR5 bit (bit 13) of the Powerdown Control/Status register 0x26 is set to a logic "1" then a 'cold reset' is require. Generally, a cold reset follows the following sequence of steps:

1. Controller 200 sets RESET# low for a minimum of 1 uS (one microsecond);
2. Codec 100 enters full power-down state;
3. The Codec 100 mixer registers reset to default values;
4. SDATA_IN and BIT_CLK signals on link 105 are held low by Codec 100;
5. Controller 200 then reasserts RESET# high;
6. The crystal oscillator (not shown) is powered up;
7. The "Reference Voltage" charge phase begins;
8. The Codec 100 internal power-on reset (POR) signal activated;
9. A clock-off detector within Codec 100 indicates that the crystal oscillator has—started (but may not be stable);

10. Crystal oscillator stabilization timeout begins;
11. Codec 100 starts BIT_CLK after crystal oscillator timeout completed (approximately 42.7 mS);
12. The Codec 100 SYNC detect circuit is activated;
13. When Codec 100 detects valid SYNC signal for 2 consecutive frames, Codec 100 begins valid data transmission on the next valid frame boundary, with the Codec Ready bit set to a logic '1';
14. Voltage Reference charges up to 80%; Codec 100 internal POR (power on reset) signal goes inactive;
15. 170.7 mS (millisecond) timeout for Vref charge phase begins following deassertion of Codec 100 internal POR;
16. The REF bit of Codec 100 register 26h set to a logic '1' after 170.7 mS timeout (221 cycles of internal 256Fs clock);
17. Codec 100 Auto Calibration begins following 170.7 mS timeout;
18. Op-Amp calibration completes -ANL (analog mixers, mux and volume controls ready) bit of register 26h set to a '1' (~128 frames);
19. ADC calibration completes in approximately 200 frames;
20. DAC calibration completes in approximately –88 Fs frames);
21. ADC (ADC 103 ready to accept data) bit of register 26h set to a '1' and DAC (DAC 106 ready to transmit data) bit of register 26h set to a '1'; and
22. Normal operation begins.

A warm reset is recognized when SYNC signal is driven active (high) when the bit clock (BIT_CLK) is not active on link 105. The SYNC signal is held high for at least 1 uS and SYNC is interpreted as an asynchronous input to Codec 100. Once SYNC has been held high for the required time, controller 200 drives SYNC low and Codec 100 activates bit clock BIT_CLK, typically after at least 2 normal BIT_CLK periods after Codec 100 samples SYNC low (typically at least 162.8 nS). A warm reset generally follows the following sequence:

1. Controller 200 sets bit $PR_4$ of Codec 100 register 26h (power Control/Status register) to a '1';
2. Codec 100 transitions SDATA_IN and BIT_CLK to logic '0's within 1 uS after Slot 2 of the SDATA_IN stream completes;
3. Codec 100 register states are frozen;
4. Controller 200 signals a warm reset by setting SYNC to a logic '1' for at least 1 uS;
5. Codec 100 detects warm reset after 1 uS and resets bit $PR_4$ (Powerdown Control/Status Register) to a logic '0'when SYNC returns to a logic '0';
6. Codec 100 starts BIT_CLK a minimum of 2 BIT_CLK periods (162.8 nS) after falling edge of SYNC;
7. Codec 100 SYNC detect circuit activated;
8. Codec 100 detects valid SYNC signal for 2 consecutive frames, and begins valid data transmission on the next valid frame boundary, with the Codec Ready bit set to a logic '1'; and
9. Codec 100 returns to normal operation, with registers set exactly as before bit $PR_4$ in the Powerdown/Status register was set.

FIG. 5 is a state diagram describing synchronization (sync) of Codec 100 with controller 200 and digital 105. The sync logic of Codec 100 is based upon an 8-bit counter which increments by one from 0 to 255 in response to BIT_CLK. The expected sync signal EX SYNC remains in a logic high state as long as the counter maintains a count in the range of 1 to 17. When the signal INSYNC transitions high Codec 100, controller 200 and link 105 are synchronized ("in sync"). INSYNC transitions high when INSYNC_ST is a 2 or a 3. INSYNC_ST is a 2 or 4 bit state variable. If Codec 100 is in sync but EXSYNC is not equal to INSYNC, then a sync-error bit is set.

A link protocol violation and/or loss of SYNC can occur if: (1) SYNC not sampled high for exactly 16 BIT_CLK cycles at the start of an audio frame; (2) SYNC not sampled high on the $256^{th}$ BIT_CLK after the previous SYNC assertion; or (3) SYNC goes active high before the $256^{th}$ BIT_CLK after the previous SYNC assertion. Advantageously, Codec 100 performs the following sequence of events to handle the situation:

1. When loss of SYNC is detected, the LINE_OUT mutes are enabled;
2. SDATA_IN is transitioned to a logic '0' on the next rising edge of BIT_CLK and will remain a logic '0' until synchronization with controller 200 is restored;
3. SDATA_OUT is ignored and the Mixer registers are frozen;
4. A SYNC detect circuit begins looking for a rising edge of SYNC;
5. Once detected, the SYNC detect circuit looks for 2 valid audio frames of SYNC clocks;
6. When the second valid SYNC is detected, Codec 100 assumes the link is again operational;
7. The LINE_OUT Mutes are disabled;
8. The Codec Ready bit is set back to a logic '1'; and
9. Normal operation is restored on the following audio frame.

The automatic setting of the LINE_OUT mutes do not override the settings in the Mixer Control Registers. The Mixer Register settings must remain as they were before the loss of SYNC once synchronization is restored. To facilitate this, Mutes should be implemented as shown FIG. 7.

Figure 6A:
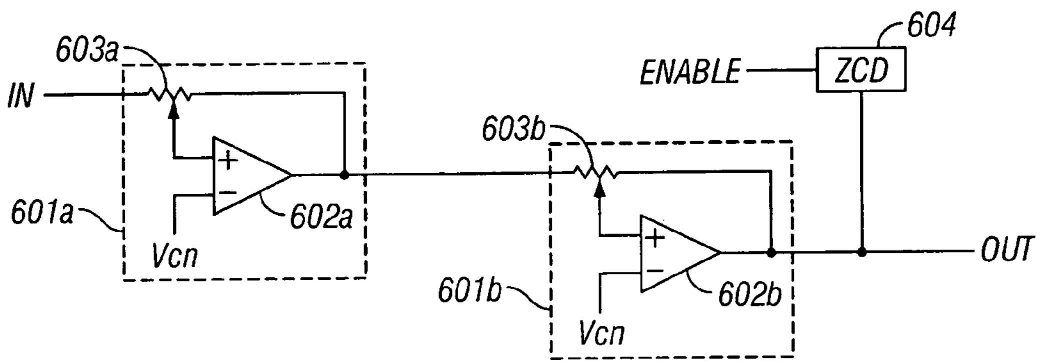
FIG. 6A is a diagram of a selected two stage output volume/mute control (attenuator) 600.

FIG. 6A is a high level functional diagram of a two stage output volume/mute control (attenuator) 600. Output volume/mute control 600 may be used to construct master volume control 327, headphone volume/mute controls 329 or mono volume/mute controls 331. For a mono output only one attenuator is required and for stereo outputs two are required; one for each channel. Advantageously, while volume/mute control 600 is a multiple stage device (two stages are shown for brevity and clarity), to users external to Codec 100, volume/mute control 600 appears to be a single stage attenuator.

As shown in FIG. 6A, a given attenuator 600 includes first and second stages 601_a_ and 601_b_ connected in series. The first stage includes an operational amplifier 602 and a 32-bit tapped resistor 603 for controlling the voltage at the non-inverting input of the corresponding operational amplifier 602. The inverting input of each operational amplifier 602 is tied to a reference voltage $V_{Cn}$. Resistors 603 are digitally controlled as discussed above.

Data is input to stage 601_a_ and output to stage 601_b_, with operational amplifier 602_b_ driving the output (i.e., the output buffers, such as 328, 330, and 332 are essentially merged into attenuators 600). The second stage, stage 601_b_, provides for 0 dB to –48 dB of attenuation in –1.5 dB steps. From then on, attenuation is added by first stage 601_a_. Specifically, first stage 601_a_ steps the attenuation from –48 dB to –94.5 dB in –1.5 dB steps.

A zero crossing detector 604 is provided at the input of second stage 601_b_. Zero crossing detector 604 is used to enable attenuator stages 601_a_ and 602_b_ when signals are being output.

Multiple stage attenuator (volume/mute control) 600 has substantial advantages over existing single stage attenuators. Among other things, second stage 602 is able to attenuate any noise output from first stage 601_a_. Additionally, by using multiple stages, each with an independent tapped resistor, the consumption of die area is substantially reduced. In particular, a single stage amplifier for providing a comparative attenuation levels would require the use of large resistors, each of which consume significant die space.

Figure 6B:
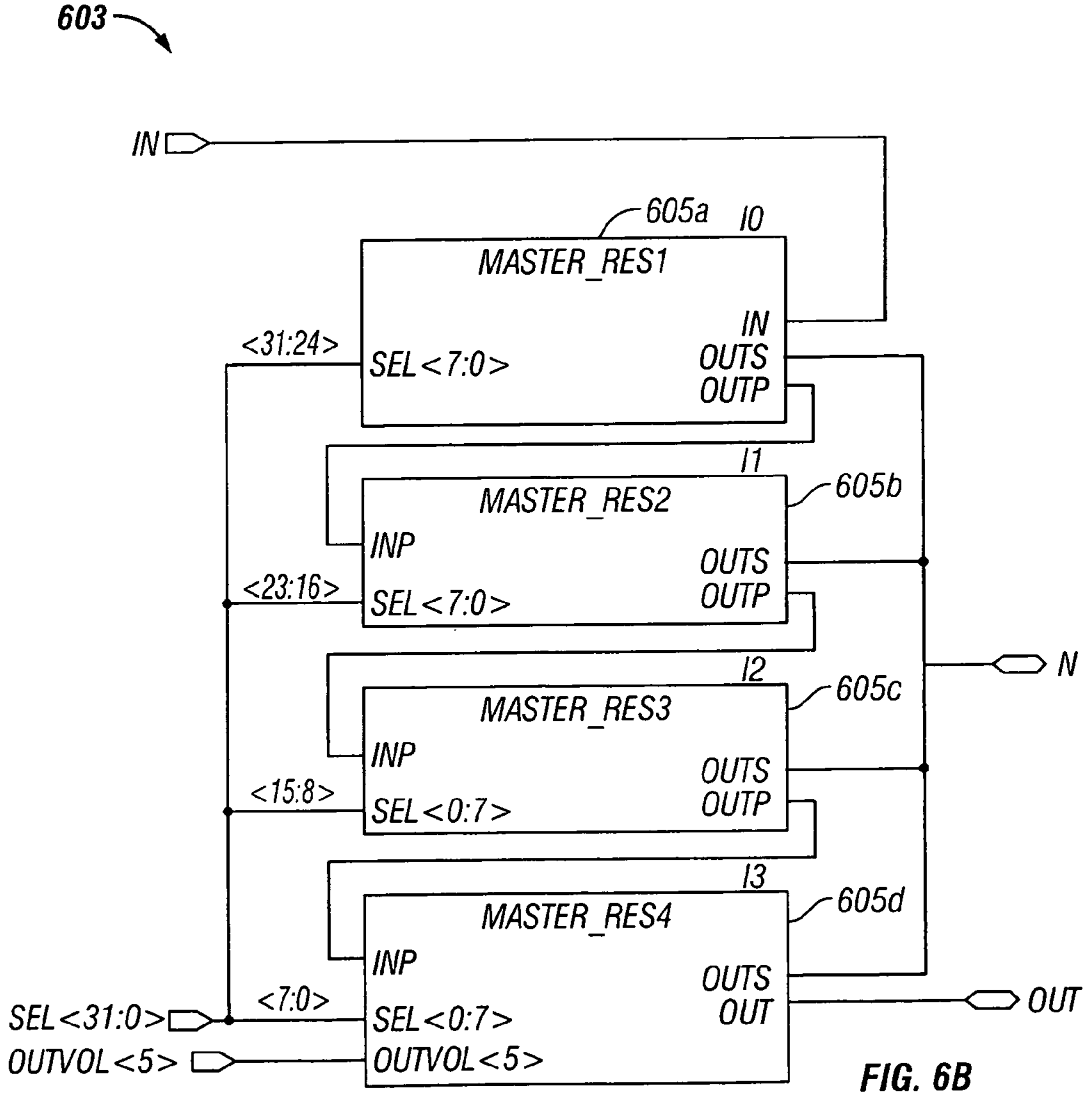
FIG. 6B is a schematic diagram of tap registers the output amplifier of FIG. 6A.

As shown in FIG. 6A, each stage has 32 bit tap register 603. Tap registers 603_a_ and 603_b_ are identical, each including 32 attenuation taps 605 as shown in FIG. 6B. Thirty-two select bits SEL[31:0] are received from decoding the bits in the output volume control register for the corresponding output being driven. One tap of one block 605_a_ is selected to set the attentuation level in steps of −1.5 dB. Each individual block 605 is controlled by a unique 8-bit subset of the 32 select bits received.

Figure 6C:
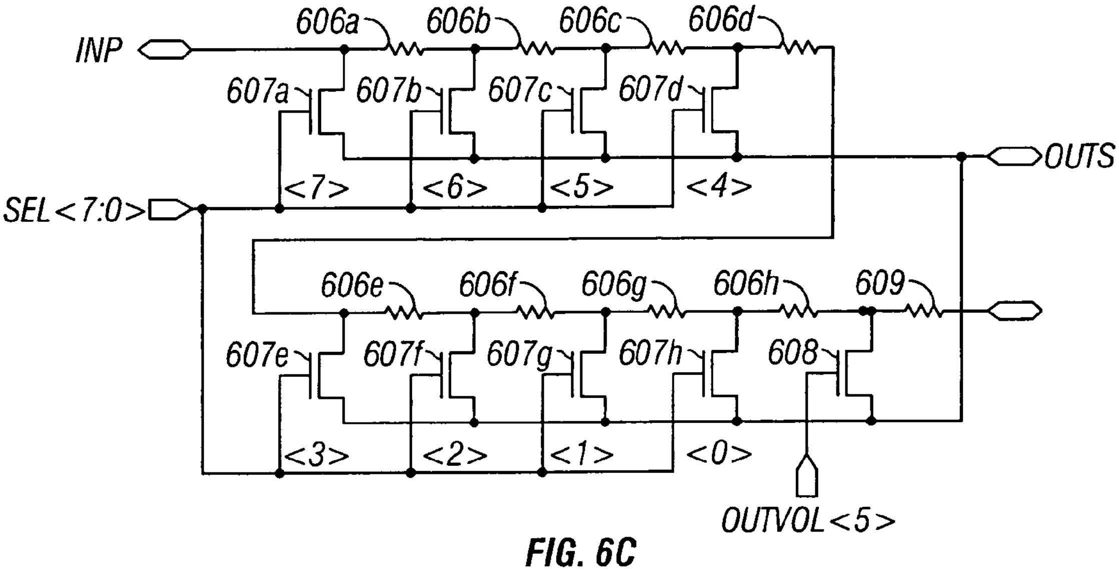
FIG. 6C is a schematic diagram of a selected block of the tap registers.
Figure 6D:
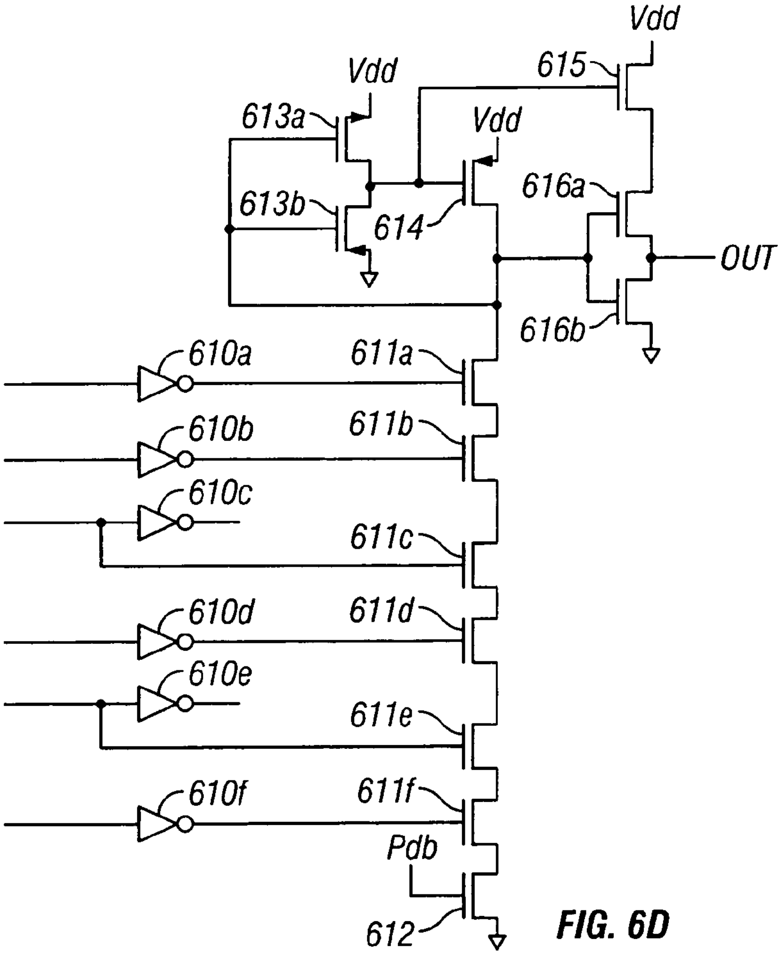
FIG. 6D is a diagram depicting a selected one of the decoders of a selected one of the tapped resistors.
Figure 7:
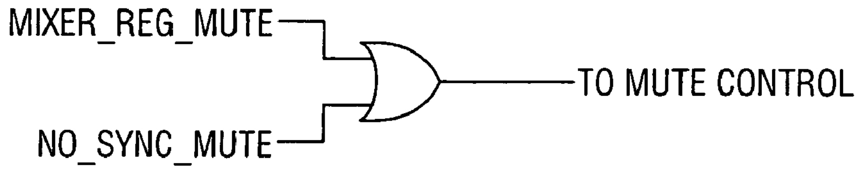
FIG. 7 is a diagram of the muting controls logic.

FIG. 6C is a more detailed schematic diagram of a selected block 605. As shown in FIG. 6C, each block 605 includes a series of resistors 606. Corresponding tap points are controlled by a transistor 607, the gate of which is in turn controlled by a corresponding one of the 8 select bits corresponding to the given block 605. A transistor 608 is provided to turn off the output. The output OUTP of each block 605 is either cascaded to the next block 605 in the chain, or is coupled to the output of the corresponding operational amplifier 602_a_ or 602_b_. The output OUTP of blocks 605 are cascaded and subsequently coupled to the non-inverting input of the given operational amplifier. The value of the resistance of each resistor 606 correspondingly increases starting with the resistor 606_h_ of block 605_d_ and similarly continues increasing through the serial chain of resistors block 605_c_, 605_b_ and 605_a_. Block 605_a_ is received from the remainder of Codec 100 in the case of stage 602_a_ and from the output of first stage 601_a_ in the case of second stage 601_b_ as required to set attenuation steps of 1.5 dB.

FIG. 6C shows for discussion purposes block 605_d_ whose output OUTP is coupled to the output of the operational amplifier through an output resistor 609 to the output of the operational amplifier as 602_a_ or 602_b_. Also assume for discussion that the selected tap point is within block 605_d_ shown in FIG. 6D. The select byte (SEL [7:0] in the case of block 605_d_) turns on one of the transistors 607 so that the corresponding tap point in the string of series resistors is coupled to the non-inverting input of the corresponding operational amplifier 602. For example, if the tap point selected is between resistor 606_a_ and 606_b_, at this tap therefore the resistance will be the sum of all of the resistance values of the resistors in blocks 605_a_, 605_b_ and 605_c_ plus the resistance value of resistor 606_a_. Consequently, the voltage at the non-inverting input of given up amplifier 602 is the value of the input voltage received at the input to block 605_a_ multiplied by the series resistance between the input of block 605_a_ and the tap point divided by the input impedance of the operational amplifier 602.

FIG. 6E is a schematic diagram depicting a selected one of the decoders of a selected one of the tapped resistors 603. Each tapped resistor 603 has 32 decoders similar to that shown in FIG. 6E, with each such decoder programmed to select one tap out of the thirty-two taps available in the given amplifier 601_a_ or 602_b_.

For discussion purposes, FIGURE C depicts a decoder for selecting tap number ten of the given tapped resistor 603. In particular, the programming of each decoder is effectuated by the interconnections between the input, inverter array composed of inverters 610, and an array of transistors 611. Decoding is enabled by applying an logic 1 (pdb) to the gate of transistor 612. Loading and output drive capability is provided by transistor 613–616.

In the example of FIG. 6E, the inverters are appropriately disconnected or not connected to ensure that when a logic 10 (010100) is received, all transistors 611 turn on which pulls down on the gates of transistors 616_a_ and 616_b_. The output is then driven to approximately Vdd (logic 1) through load transistors 615. The output then becomes part of the 32-bit word passed on to the tapped resistor network. In this example, because of the interconnections of the inverters 610 and 611 of the thirty-one other select lines of the select bus SEL[31:0] are in a logic low state.

Table 24 describes the coding inputs to decoders 603_a_ and 603_b_. As previously stated, second stage 601_a_ introduces an attenuation of 0 to −48 dB and attenuator stage 1 601_a_ continues stepping the attenuation up to −94.5 dB. When the most significant bit is set to 0, stage two provides all the attenuation and data simply passes through stage one. The inputs to each decoder 603 are provided by the volume/mute control register (TABLE 5) corresponding to the given output line (i.e., LINE_OUT, HB_OUT, AUX_OUT, or MONO_OUT). As shown in TABLE 4, the increment by one least significant bit corresponds to a step of −1.5 dB. When the most significant bit is set to 0, stage two 601_b_ provides attenuation in the range of 0 dB (select=00000) to −46.5 dB (select=11111). When the most significant bit is set to 1, stage 2 provides an attenuation of −48 dB and remains at that attenuation level as long as the most significant bit is set to 1. Further, when the most significant bit is set to a logic 1, stage 1 adds attenuation to the −48 dB attenuation provided by stage 2. Specifically, stage 1 adds from 0 dB (select=10000) to −46 dB (select=11111). Thus, for example, when select=11111, the total attenuation provided is −94.5 dB.

The primary test modes are defined in the following TABLE 15. A write to the least significant 4 bits (bits $T_3$-T0) in register 5Ch (Test Modes) with the appropriate test mode identifier will send Codec 100 into that test mode. When test modes 2, 3, 4, or 10 are entered, a cold reset is required to return the chip to normal operation, or to enter another test mode. When a test mode is entered AC-Link 105 remains fully active. Codec 100 will enter a primary test mode if SYNC is sampled high (logic '1') when RESET# is deasserted. If both SDATA_OUT and SYNC are high when RESET# deasserts, this is a fault condition, and no test mode is entered. Once a test mode is entered, a cold reset is issued to restore normal operation.

The ADC 1-Bit Left Channel Data Test connects the output of the left channel ADC Delta Sigma Modulator of main ADCs 103. to the SDATA_IN pin. Similarly, the ADC 1-Bit Right Channel Data Test connects the output of the right channel ADC Delta Sigma Modulator of Codec 100 to the SDATA_IN pin. These two tests allow the 1-bit data generated by the modulator for each channel to be probed externally during analog test.

The DAC 1-Bit Left Channel Data and DAC 1-Bit Right Channel Data Tests respectively connect the output of the left channel and right channel DAC Modulators to the SDATA_IN pin. This allows the 1-bit data generated by each modulator to be observed by test equipment external to Codec 100, providing an digital test of the DAC for each channel.

The Analog and Digital Wrap Test breaks the connections between the DAC Modulators and Switch Capacitor Filters within main DACs 106 and between the Delta Sigma Modulators and the ADC 103 Decimation Filters within main ADCs 103. Then, the outputs of the DAC Modulators are connected to the inputs of the ADC Decimation Filters to facilitate a digital wrap test. Likewise, the outputs of the ADC Delta Sigma Modulators are connected to the inputs of the DAC Switch Capacitor Filters for an analog wrap test.

The Disable Zero Cross Detect test bypasses the ZCD (zero cross detect) circuitry in the volume control registers. This allows instant updates of volume settings for any analog volume control registers. The Zero-Cross Detection Test disables the slow clock to the ZCD circuitry.

Test Slow Counters changes the clock to the volume control time-out counters from an Fs clock to a 256Fs clock to facilitate test of the slow counters.

The Test Op-Amps test allows each op-amp to be connected to the MONO__OUT output such that all op-amps can be externally tested. This is done by writing a single bit somewhere in the mixer control registers. When this write occurs, any previous op-amp which was connected to the output is disconnected, and the newly selected op-amp is connected. For each op-amp, the assigned bit is different. Whenever possible, a bit which controls the gain for a particular op-amp is used. The mapping list is provided in TABLE 16

The NAND Tree Enabled test forces outputs of BIT__CLK and SDATA__IN to be connected to the output of a NAND Tree which consists of SYNC with SDATA__OUT. This facilitates $V_{ih}$ and $V_{il}$ testing.

When asserted, Disable Calibration automatic calibration is disabled for all analog sections of Codec When Force Op-Amp Calibration is set, all op-amps in the analog mixer begin calibration.

When Force ADC Calibration is set, the stereo ADCs in the analog mixer 322 begin calibration.

The Force DAC Calibration initiates calibration of the DACs in analog mixer 322.

Enable Cal Register Writes: When the test mode register is set to mode 0xf, write access to the Calibration registers is enabled. In other words, the protocol of using Codec Mixer registers 0x76, 0x78, and 0x7A to write new values to the Calibration registers is enabled. Whenever the test mode register bits are any other pattern than 0xf, writes will not be allowed to the Calibration registers.

Codec 100 further provides for the testing of selected optional features. For example, Codec 100 will enter an ATE modem in circuit test mode if SDATA__OUT is sampled logic high ('1') when RESET# is deasserted (driven high).

Figure 8:
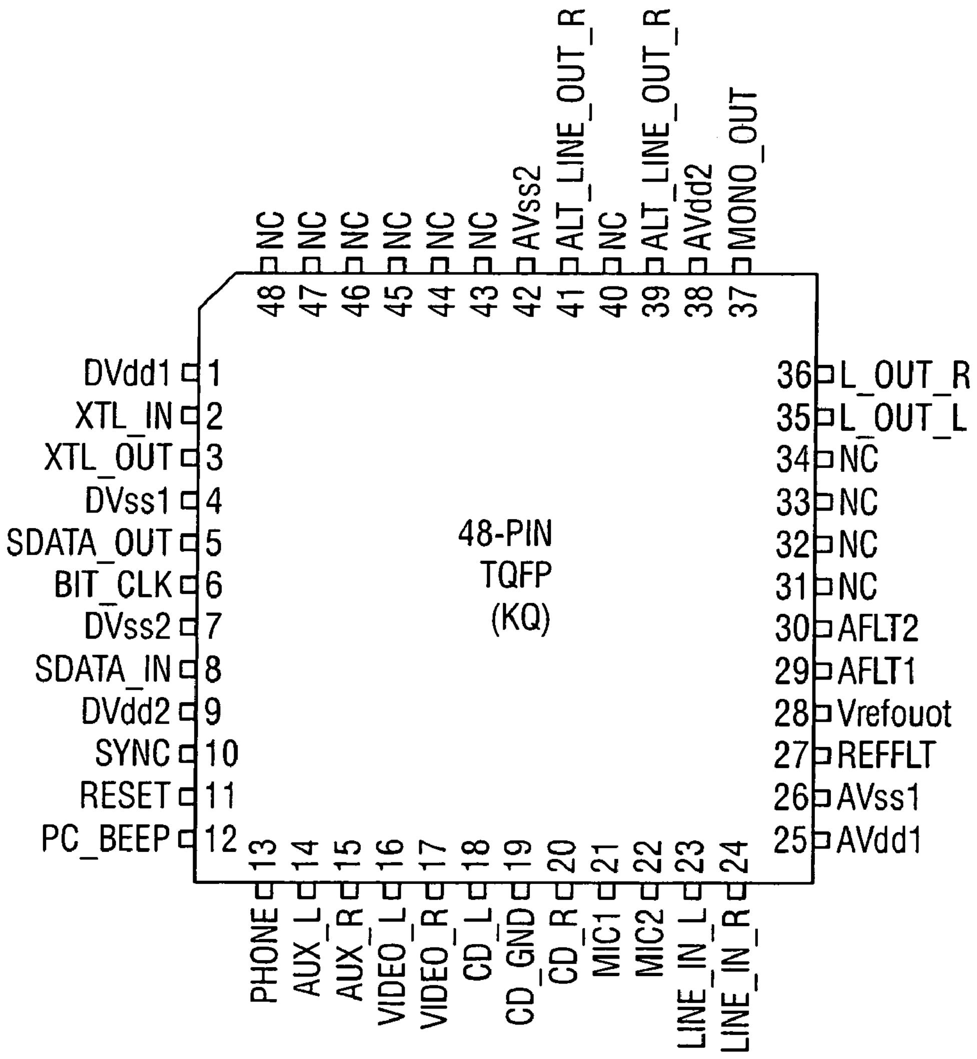
FIG. 8 shows the pinout for Codec 100 for a 48-pin TQFP package.

The pinout for Codec 100 is shown in FIG. 8 for a 48-pin TQFP package. This package provides a 4.5 mm×4.5 mm cavity for the die. TABLE 18 is a tabular listing of the pins and corresponding signals.

TABLE 19 generally describes the functions of the digital I/O pins for Codec 100. The analog source and sink pins are likewise described in TABLE 20.

The filter and Reference pins are those pins which are normally connected to external resistors, capacitors, or specific voltages. TABLE 20 generally sets forth the Filter and Reference Voltage pins.

TABLE 21 generally describes the power supply and ground connections to Codec 100. Codec 100 is capable of running the Digital Interface at either 5.0V or 3.3V. The analog subsection is normally always run at 5.0V.

The DC characteristics for AC Link 105 are set forth in TABLE 22. The AC characteristics for Codec 100, including those of the signals supporting AC Link 105 are generally described in TABLE 23.

It is therefore, contemplated that the claims will cover any such modifications or embodiments that fall within the true scope of the invention.

TABLE 1

| Slot # | Definition |
|---|---|
| 0 | Tag/Control Information |
| 1 | Command Address Port |
| 2 | Command Data Port |
| 3 | PCM Playback Left Data |
| 4 | PCM Playback Right Data |
| 5–12 | Reserved |

TABLE 2

| Bit # | Definition |
|---|---|
| 19 | Read/Write Command |
| 18–12 | Control Register Index |
| 11–0 | Reserved |

TABLE 3

| Slot # | Definition |
|---|---|
| 0 | Tag/Control Information |
| 1 | Status Address Port |
| 2 | Status Data Port |
| 3 | PCM Record Left Data |
| 4 | PCM Record Right Data |
| 5–12 | Reserved |

TABLE 4

| Bit # | Definition |
|---|---|
| 19 | Reserved (return 0) |
| 18–12 | Control Register Index |
| 11–0 | Reserved (return 0's) |

TABLE 5

| Reg Num | Name | D15 | D14 | D13 | D12 | D11 | D10 | D9 | D8 | D7 | D6 | D5 | D4 | D3 | D2 | D1 | D0 | Default |
|---|---|---|---|---|---|---|---|---|---|---|---|---|---|---|---|---|---|---|
| 00h | Reset | 0 | 0 | 0 | 0 | 0 | 0 | 0 | 1 | 0 | 1 | 0 | 1 | 0 | 0 | 0 | 0 | 0150h |
| 02h | Master Volume | Mute | X | ML5 | ML4 | ML3 | ML2 | ML1 | ML0 | X | X | MR5 | MR4 | MR3 | MR2 | MR1 | MR0 | 8000h |
| 04h | Alternate Line Out Volume | Mute | X | ML5 | ML4 | ML3 | ML2 | ML1 | ML0 | X | X | MR5 | MR4 | MR3 | MR2 | MR1 | MR0 | 8000h |
| 06h | Master Volume Mono | Mute | X | X | X | X | X | X | X | X | X | MM5 | MM4 | MM3 | MM2 | MM1 | MM0 | 8000h |
| 08h | Reserved | 0 | 0 | 0 | 0 | 0 | 0 | 0 | 0 | 0 | 0 | 0 | 0 | 0 | 0 | 0 | 0 | 0000h |
| 0Ah | PC_BEEP Volume | Mute | X | X | X | X | X | X | X | X | X | X | PV3 | PV2 | PV1 | PV0 | X | x000h |
| 0Ch | Phone Volume | Mute | X | X | X | X | X | X | X | X | X | GN5 | GN4 | GN3 | GN2 | GN1 | GN0 | 8008h |
| 0Eh | Mic Volume | Mute | X | X | X | X | X | X | X | X | 20 dB | GN5 | GN4 | GN3 | GN2 | GN1 | GN0 | 8008h |
| 10h | Line in Volume | Mute | X | X | GL4 | GL3 | GL2 | GL1 | GL0 | X | X | X | GR4 | GR3 | GR2 | GR1 | GR0 | 8808h |
| 12h | CD Volume | Mute | X | X | GL4 | GL3 | GL2 | GL1 | GL0 | X | X | X | GR4 | GR3 | GR2 | GR1 | GR0 | 8808h |
| 14h | Video Volume | Mute | X | X | GL4 | GL3 | GL2 | GL1 | GL0 | X | X | X | GR4 | GR3 | GR2 | GR1 | GR0 | 8808h |
| 16h | Aux Volume | Mute | X | X | GL4 | GL3 | GL2 | GL1 | GL0 | X | X | X | GR4 | GR3 | GR2 | GR1 | GR0 | 8808h |
| 18h | PCM Out Vol | Mute | X | X | GL4 | GL3 | GL2 | GL1 | GL0 | X | X | X | GR4 | GR3 | GR2 | GR1 | GR0 | 8808h |
| 1Ah | Record Select | X | X | X | X | X | SL2 | SL1 | SL0 | X | X | X | X | X | SR2 | SR1 | SR0 | 0000h |
| 1Ch | Record Gain | Mute | X | X | X | GL3 | GL2 | GL1 | GL0 | X | X | X | X | GR3 | GR2 | GR1 | GR0 | 8000h |
| 1Eh | Reserved | 0 | 0 | 0 | 0 | 0 | 0 | 0 | 0 | 0 | 0 | 0 | 0 | 0 | 0 | 0 | 0 | 0000h |
| 20h | General Purpose | 0 | 0 | 0 | 0 | 0 | 0 | MIX | MS | LPBK | 0 | 0 | 0 | 0 | 0 | 0 | 0 | 0000h |
| 22h | Reserved | 0 | 0 | 0 | 0 | 0 | 0 | 0 | 0 | 0 | 0 | 0 | 0 | 0 | 0 | 0 | 0 | 0000h |
| 24h | Reserved | 0 | 0 | 0 | 0 | 0 | 0 | 0 | 0 | 0 | 0 | 0 | 0 | 0 | 0 | 0 | 0 | 0000h |
| 26h | Powerdown Ctrl/Stat | 0 | PR6 | PR5 | PR4 | PR3 | PR2 | PR1 | PR0 | 0 | 0 | 0 | 0 | REF | ANL | DAC | ADC | 0000h |
| 28h | Reserved | 0 | 0 | 0 | 0 | 0 | 0 | 0 | 0 | 0 | 0 | 0 | 0 | 0 | 0 | 0 | 0 | 0000h |
| . | . | . | . | . | . | . | . | . | . | . | . | . | . | . | . | . | . | . |
| . | . | . | . | . | . | . | . | . | . | . | . | . | . | . | . | . | . | . |
| . | . | . | . | . | . | . | . | . | . | . | . | . | . | . | . | . | . | . |
| 5Ah | Reserved | X | X | X | X | X | X | X | X | X | X | X | X | X | X | X | X | XXXXh |
| . | . | . | . | . | . | . | . | . | . | . | . | . | . | . | . | . | . | . |
| . | . | . | . | . | . | . | . | . | . | . | . | . | . | . | . | . | . | . |
| . | . | . | . | . | . | . | . | . | . | . | . | . | . | . | . | . | . | . |
| 76h | Reserved | X | X | X | X | X | X | X | X | X | X | X | X | X | X | X | X | XXXXh |
| 78h | Reserved | X | X | X | X | X | X | X | X | X | X | X | X | X | X | X | X | XXXXh |
| 7Ah | Reserved | X | X | X | X | X | X | X | X | X | X | X | X | X | X | X | X | XXXXh |
| 7Ch | Vendor ID1 (CR) | 0 | 1 | 0 | 0 | 0 | 0 | 1 | 1 | 0 | 1 | 0 | 1 | 0 | 0 | 1 | 0 | 4352h |
| 7Eh | Vendor ID2 (Y1) | 0 | 1 | 0 | 1 | 1 | 0 | 0 | 1 | 0 | 0 | 0 | 0 | 0 | 0 | 0 | 1 | 5901h |

TABLE 6

Analog Mixer Input Gain Values

| Gx4 · Gx0 | Gain Level |
|---|---|
| 00000 | +12 dB |
| 00001 | +10.5 dB |
| . . . | . . . |
| 00111 | +1.5 dB |
| 01000 | 0 dB |
| 01001 | −1.5 dB |
| . . . | . . . |
| 11111 | −94.5 dB |

TABLE 7

Input Mux Selection Options

| 8x2 · 8x0 | Record Source |
|---|---|
| 0 | MIC |
| 1 | CD Input |
| 2 | Video Input |
| 3 | AUX Input |
| 4 | Line Input |
| 5 | Stereo Mix |
| 6 | Mono Mix |
| 7 | Phone Input |

TABLE 8

Input Mux Selection Options

| Gx3 · Gx0 | Gain |
|---|---|
| 1111 | +22.5 dB |
| 0000 | 0 dB |

TABLE 9

Codec Powerdown Status Bits

| Bit Name | Function |
|---|---|
| REF | Vref at nominal levels |
| ANL | Analog Mixers, Mux, and Volume Controls ready |
| DAC | DAC ready to accept data |
| ADC | ADC ready to transmit data |

TABLE 10

Codec Powerdown Control Bits

| Bit Name | Function |
|---|---|
| PR0 | ADCs and Input Mux Powerdown |
| PR1 | DACs Powerdown |
| PR2 | Analog Mixer Powerdown (Vref still on) |
| PR3 | Analog Mixer Powerdown (Vref off) |
| PR4 | AC-Link Powerdown (BIT_CLK off) |
| PR5 | Internal Clock Disable |
| PR6 | Alternate Line Output Buffer Powerdown |

TABLE 11

ADC Calibration Register Address Mapping

| A1–A0 | ADC Accessed |
|---|---|
| 0 | None |
| 1 | ADC Main Left Channel |
| 2 | ADC Main Right Channel |
| 3 | Reserved |

TABLE 12

DAC Calibration Register Address Mapping

| D1–D0 | DAC Accessed |
|---|---|
| 0 | None |
| 1 | DAC Main Left Channel |
| 2 | DAC Main Right Channel |
| 3 | Reserved |

TABLE 13

Powerdown GPR Bit Functions

| PR Bit | Function |
|---|---|
| PR0 | Main ADC's and Input Mux Powerdown |
| PR1 | Main DAC's Powerdown |
| PR2 | Analog Mixer Powerdown (Vref on) |
| PR3 | Analog Mixer Powerdown (Vref on) |
| PR4 | AC-Link Powerdown (BIT_CLK off) |
| PR5 | Internal Clock Disable (lockup) |
| PR6 | Alternate Line Out Buffer Powerdown |

TABLE 14

Powerdown Control Signals

| PDN Signal | PR0 | PR1 | PR2 | PR3 | PR4 | PR5 | PR6 | Equation |
|---|---|---|---|---|---|---|---|---|
| PDN_DAC | X | 1 | 1 | 1 | X | 1 | X | PR1 + PR2 + PR3 + PR5 |
| PDN_ADC | 1 | X | X | 1 | X | 1 | X | PR0 + PR3 + PR5 |
| PDN_MIX | X | X | 1 | 1 | X | 1 | X | PR2 + PR3 + PR5 |
| PDN_REF | X | X | X | 1 | X | 1 | X | PR3 + PR5 |
| PDN_BITCLK | X | X | X | X | 1 | 1 | X | PR4 + PR5 |

TABLE 14-continued

| Powerdown Control Signals | | | | | | | | |
|---|---|---|---|---|---|---|---|---|
| PDN Signal | PR0 | PR1 | PR2 | PR3 | PR4 | PR5 | PR6 | Equation |
| PDN_ALT_LINE | X | X | 1 | 1 | X | 1 | 1 | PR2 + PR3 + PR5 + PR6 |
| PDN_CLK256_INT | X | X | X | X | X | 1 | X | PR5 |

TABLE 15

| Test Mode | Test Name |
|---|---|
| 0 | None - normal operation |
| 1 | ADC 1-bit Left Channel Data Test |
| 2 | ADC 1-bit Right Channel Data Test |
| 3 | DAC 1-bit Left Channel Data Test |
| 4 | DAC 1-bit Right Channel Data Test |
| 5 | Analog and Digital Wrap Test |
| 6 | Disable Zero-Cross Detect |
| 7 | Zero Cross Detect Test |
| 8 | Test Slow Counters |
| 9 | Test OpAmps |
| 10 | NAND Tree Enabled |
| 11 | Disable Calibration |
| 12 | Force OPAMP Calibration |
| 13 | Force ADC Calibration |
| 14 | Force DAC Calibration |
| 15 | Enable Calibration Register Writes |

TABLE 16

| Op-Amp | Output Enable Bit | Mixer Register Bit |
|---|---|---|
| PC_BEEP | LSB of attn bits | Bit D1 of Register 0xa |
| PHONE | LSB of gain/attn bits | Bit D0 of Register 0xC |
| PCM_OUT_LEFT | LSB of gain/attn bits | Bit D8 of Register 0x18 |
| PCM_OUT_RIGHT | LSB of gain/attn bits | Bit D0 of Register 0x18 |
| MIC_BOOST | 0/20 dB Control Bit | Bit D6 of Register 0xE |
| MIC | LSB of gain/attn bits | Bit D0 of Register 0xE |
| LINE_LEFT | LSB of gain/attn bits | Bit D6 or Register 0x10 |
| LINE_RIGHT | LSB of gain/attn bits | Bit D0 of Register 0x10 |
| CD_LEFT | LSB of gain/attn bits | Bit D8 of Register 0x12 |
| CD_RIGHT | LSB of gain/attn bits | Bit D0 of Register 0x12 |
| VIDEO_LEFT | LSB of gain/attn bits | Bit D8 of Register 0x14 |
| VIDEO_RIGHT | LSB of gain/attn bits | Bit D0 of Register 0x14 |
| AUX_LEFT | LSB of gain/attn bits | Bit D8 of Register 0x16 |
| AUX_RIGHT | LSB of gain/attn bits | Bit D0 of Register 0x16 |
| ADC_INMUX_LEFT | CD_LEFT_SEL | Bit D6 of Register 0x1A |
| ADC_INMUX_RIGHT | CD_RIGHT_SEL | Bit D0 of Register 0x1A |
| ADC_INGAIN_LEFT | LSB of gain bits | Bit D6 of Register 0x1C |
| ADC_INGAIN_RIGHT | LSB of gain bits | Bit D0 of Register 0x1C |
| Analog Input Mixer Left | NMUTE_LINE_L | Bit D15 of Register 0x10 |

TABLE 16-continued

| Op-Amp | Output Enable Bit | Mixer Register Bit |
|---|---|---|
| Analog Input Mixer Right | NMUTE_CD_L | Bit D15 of Register 0x12 |
| Analog Output Mixer Left | NMUTE_PHONE | Bit D15 of Register 0xC |
| Analog Output Mixer Right | NMUTE_MIC | Bit D15 of Register 0xE |
| MONO_OUT Stereo to Mono Mixer | NMUTE_VIDEO_L | Bit D15 of Register 0x14 |
| ADC_INMUX Stereo to Mono Mixer | NMUTE_AUX_L | Bit D15 of Register 0x16 |
| LINE_OUT_LEFT First Stage | LSB of attn bits | Bit D8 of Register 0x2 |
| LINE_OUT_RIGHT First Stage | LSB of attn bits | Bit D0 of Register 0x2 |
| LINE_OUT_LEFT Second Stage | Bit 1 of attn bits | Bit D9 of Register 0x2 |
| LINE_OUT_RIGHT Second Stage | Bit 1 of attn bits | Bit D1 of Register 0x2 |
| ALT_LINE_OUT_LEFT First Stage | LSB of attn bits | Bit D8 of Register 0x4 |
| ALT_LINE_OUT_RIGHT First Stage | LSB of attn bits | Bit D0 of Register 0x4 |
| ALT_LINE_OUT_LEFT Second Stage | Bit 1 of attn bits | Bit D9 of Register 0x4 |
| ALT_LINE_OUT_RIGHT Second Stage | Bit 1 of attn bits | Bit D1 of Register 0x4 |
| MONO_OUT First Stage | LSB of attn bits | Bit D0 of Register 0x6 |
| MONO_OUT Second Stage | Bit 1 of attn bits | Bit D1 of Register 0x6 |

TABLE 17

| Pin # | Signal Name |
|---|---|
| 1 | DVdd1 |
| 2 | XTL_IN |
| 3 | XTL_OUT |
| 4 | DVas1 |
| 5 | SDATA_OUT |
| 6 | BIT_CLK |
| 7 | DVas2 |
| 8 | SDATA_IN |
| 9 | DVdd2 |
| 10 | SYNC |
| 11 | RESET# |
| 12 | PC_BEEP |
| 13 | PHONE |
| 14 | AUX_L |
| 15 | AUX_R |
| 16 | VIDEO_L |
| 17 | VIDEO_R |
| 18 | CD_L |
| 19 | CD_GND |
| 20 | CD_R |
| 21 | MIC1 |
| 22 | MIC2 |
| 23 | LINE_IN_L |
| 24 | LINE_IN_R |
| 25 | AVdd1 |
| 26 | AVss1 |

TABLE 17-continued

| Pin # | Signal Name |
|---|---|
| 27 | RefFilt |
| 28 | Vref |
| 29 | AFILT1 |
| 30 | AFILT2 |
| 31 | nc |
| 32 | nc |
| 33 | nc |
| 34 | nc |
| 35 | LINE_OUT_L |
| 36 | LINE_OUT_R |
| 37 | MONO_OUT |
| 38 | AVdd2 |
| 39 | ALT_LINE_OUT_L |
| 40 | nc |
| 41 | ALT_LINE_OUT_R |
| 42 | AVss2 |
| 43 | nc |
| 44 | nc |
| 45 | nc |
| 46 | nc |
| 47 | nc |
| 48 | nc |

TABLE 18

| Signal Name | I/O | Description |
|---|---|---|
| XTL_IN | I | 24.576 MHz Crystal Input |
| XTL_OUT | O | 24.576 MHz Crystal Output |
| BIT_CLK | O | 12.288 MHz Serial Data Clock |
| SYNC | I | 48 kHz Sample Sync Clock |
| SDATA_OUT | I | Serial AC97 Input Stream |
| SDATA_IN | O | Serial AC97 Output Stream |
| RESET# | I | Asynchronous AC97 HW Reset |

TABLE 19

| Signal Name | I/O | Description |
|---|---|---|
| PC_BEEP | I | PC Speaker Beep |
| PHONE | I | From Telephone Speakerphone |
| MIC1 | I | Desktop Microphone Input |
| MIC2 | I | Second Microphone Input |
| LINE_IN_L | I | Line in Left Channel |
| LINE_IN_R | I | Line in Right Channel |

TABLE 19-continued

| Signal Name | I/O | Description |
|---|---|---|
| CD_L | I | CD Audio Left Channel Input |
| CD_GND | I | CD Audio Analog Ground |
| CD_R | I | CD Audio Right Channel Input |
| VIDEO_L | I | Video Audio Left Channel Input |
| VIDEO_R | I | Video Audio Right Channel Input |
| AUX_L | I | Auxilliary Left Channel Input |
| AUX_R | I | Auxilliary Right Channel Input |
| LINE_OUT_L | O | Line Out Left Channel |
| LINE_OUT_R | O | Line Out Right Channel |
| ALT_LINE_OUT_L | O | Alternate Line Out Left Channel |
| ALT_LINE_OUT_R | O | Alternate Line Out Right Channel |
| MONO_OUT | O | To Telephony Speakerphone |

TABLE 20

Table 21: Bonnie Filter and Reference Voltages

| Signal Name | I/O | Description |
|---|---|---|
| REFFLT | O | Reference Voltage Filter |
| VREF | O | Reference Voltage Output |
| AFILT1 | O | Main Left ADC Filter Cap |
| AFILT2 | O | Main Right ADC Filter Cap |

TABLE 21

| Signal Name | I/O | Description |
|---|---|---|
| AVdd1 | I | Analog Vdd - 5.0 V |
| AVdd2 | I | Analog Vdd - 5.0 V |
| AVdd3 | I | Analog Vdd - 5.0 V |
| AVss1 | I | Analog Ground |
| AVss2 | I | Analog Ground |
| AVss3 | I | Analog Ground |
| DVdd1 | I | Digital Vdd - 5.0 V or 3.3 V |
| DVdd2 | I | Digital Vdd - 5.0 V or 3.3 V |
| DVss1 | I | Digital Ground |
| DVss2 | I | Digital Ground |

TABLE 22

| Parameter | Symbol | Min | Typ | Max | Units |
|---|---|---|---|---|---|
| Input Voltage range | Vin | −0.30 | — | DVdd + 0.30 | V |
| Low Level Input Voltage | Vil | — | — | 0.30 * Vdd | V |
| High Level Input Voltage | Vih | 0.40 * Vdd | — | — | V |
| High Level Output Voltage | Voh | 0.60 * Vdd | — | — | V |
| Low Level Output Voltage | Vol | — | — | 0.10 * Vdd | V |
| Input Leakage Current (AC-Link Inputs) | — | −10 | — | 10 | uA |
| Output Leakage Current (HI-Z AC-Link Outputs) | — | −10 | — | 10 | uA |
| Output Buffer Drive Current | — | — | 5 | — | mA |

TABLE 23

AC CHARACTERISTICS (Standard test conditions unless otherwise noted: $T_{ambient}$ = 25° C., AVdd = DVdd = 5.0 V +/− 5%; Input Voltage Levels: Logic Low = 0.8 V, Logic High = 2.4 V; 1 kHz input sine wave; Sample Frequency = 48 kHz; 0 dB = 1Vrms, 10kW/50pF load (Note 1) This data is preliminary.

| Parameter | | Min | Typ | Max | Units |
|---|---|---|---|---|---|
| Full Scale Input Voltage: | | | | | |
| Line inputs | | — | 1.0 | — | $V_{rms}$ |
| Mic Inputs | (Note 3) | — | 0.1 | — | |
| Full Scale Output Voltage: | | | | | |
| Line Output | | — | 1.0 | — | $V_{rms}$ |
| Headphone Output (Alternate Line Output) | | — | 1.0 | — | |
| Analog S/N: | | | | | |
| CD to LINE_OUT | | 90 | — | — | dB |
| Other to LINE_OUT | | — | 85 | — | |
| Analog Frequency Response | (Note 4) | 20 | — | 20,000 | Hz |
| Digital S/N | (Note 5) | | | | |
| D/A | (Note 2) | 80 | 0.1 | — | dB |
| A/D | | 80 | 0.1 | — | |
| Total Harmonic Distortion: | | | | | |
| Line Output | (Note 6) | — | — | — | % |
| Headphone Output (Alternate Line Output) | | — | — | — | |
| D/A & A/D Frequency Response | (Note 7) | 20 | — | 19,200 | Hz |
| Transition Band | | 0.4 $F_3$ | — | 0.6$F_3$ | Hz |
| Stop Band | | 0.6 $F_3$ | — | — | Hz |
| Stop Band Rejection | (Note 8) | 74 | — | — | dB |
| Out-of-Band Energy | (Note 9) | — | | −45 | dB |
| Group Delay | (Note 2) | — | — | 1 | ms |
| Power Supply Rejection Ratio (1 KHz) | (Note 2) | 40 | — | — | dB |
| Interchannel Isolation | | — | 80 | — | dB |
| Spurious Tone Reduction | | — | −100 | — | dB |
| Attenuation, Gain Step Size | | — | 1.5 | — | dB |
| Input Impedance | (Note 2) | 10 | — | — | kΩ |
| External Load Impedance | (Note 2) | 10 | | | kΩ |
| Input Capacitance | (Note 2) | — | 15 | — | pF |
| Vrefout | | — | 2.2 | — | V |

Notes:
3. With +20 dB Boost on, 1.0 Vrms with Boost off
4. ±1 dB limits Analog frequency response refers to analog signal paths only. No digital signal paths are included
5. The ratio of the rms output level with 1 KHz full scale input to the rms output level with all zeros into the digital input. Measured "A wtd" over a 20 Hz to a 20 KHz bandwidth. (AES17-1991 Idle Channel Noise or EIAJ CP-307 Signal-to-noise Ratio).
6. −3 dB gain. 20 KHz BW, 48 KHz Sample Frequency
7. + −0.25 dB limits
8. Stop Band rejection determines filter requirements. Out-of-band rejection determines audible noise.
9. The integrated Out-of-Band generated by the DAC process, during normal PCM audio playback, over a bandwidth 28.8 kHz to 100 kHz, with respect to a $1V_{RMS}$ DAC output.

TABLE 24

| SELECT VALUE | Stage 1 | Stage 2 | Attenuation Total |
|---|---|---|---|
| 0 0 0 0 0 0 | 0 dB | 0 dB | 0 dB |
| 0 0 0 0 0 1 | 0 dB | −1.5 dB | −1.5 d |
| " | " | " | |
| " | " | " | |
| " | " | " | |
| 0 1 1 1 1 1 | 0 dB | −46.5 dB | −46.5 dB |
| 1 0 0 0 0 0 | 0 dB | −48 dB | −48 dB |
| 1 0 0 0 0 1 | −1.5 dB | −48 dB | −49.5 dB |
| " | " | " | " |
| " | " | " | " |
| " | " | " | " |
| 1 1 1 1 1 1 | −46.5 dB | −48 dB | −94.5 dB |

What is claimed is:

1. An attenuator comprising;

a first stage comprising:

a first operational amplifier;

a tapped resistor having an input for receiving input data, an output coupled to an output of said first operational amplifier, and a plurality of taps for selectively presenting a sequence of voltages to a noninverting input of said first operational amplifier, each of said sequence of voltages corresponding to an attenuation step, said first stage in response to said sequence of voltages stepping an attenuation produced by said attenuator from an intermediate value to a predetermined ending value; and a second stage comprising:

a second operational amplifier;

a tapped resistor having an input for receiving analog data from said first stage, an output coupled to an output of said second operational amplifier, and a plurality of taps for selectively presenting a sequence of voltages to a noninverting input of said second operational amplifier, each of said sequence of voltages corresponding to an attenuation step, said second stage stepping said attenuation for a predetermined starting value to said intermediate value.

2. The attenuator of claim 1 wherein said first stage responds to a first set of control bits and said second stage responds to a second set of control bits received by said attenuator.

3. The attenuator of claim 2 wherein an attenuation of said second stage is fixed at said intermediate value when a one of said first set of control bits is received by said attenuator.

4. The attenuator of claim 1 wherein each said tapped resistor comprises:

a plurality of resistors coupled in series, a tap disposed between selected pairs of said resistors, values of said resistors predetermined to provide a predetermined voltage at each tap; and a decoder for selectively coupling a said tap to said non-inverting input of said amplifier of a corresponding stage.

5. The attenuator of claim 2 wherein said decoder comprises a plurality of decoding circuits each for controlling a corresponding one of said taps, each said decoding circuit comprising:

output drive circuitry;

a plurality of transistors coupled in series for selectively activating and deactivating a corresponding decoder output line through output drive circuitry; and a plurality of inverters selectively coupled to gates of said transistors such that said transistors activate and deactivate said corresponding output upon receiving an assigned subset of a selected one of first and second sets of bits.

* * * * *

UNITED STATES PATENT AND TRADEMARK OFFICE
CERTIFICATE OF CORRECTION

PATENT NO. : 6,980,056 B1 
DATED : December 27, 2005
INVENTOR(S) : Mark Alexander et al.

It is certified that error appears in the above-identified patent and that said Letters Patent is hereby corrected as shown below:

Column 11,
Line 25, "PC PEEP" should be -- PC_BEEP --;

Column 15,
Line 15, "221" should be -- $2^{21}$ --;
Lines 40, 49 and 60, "$PR_4$" should be -- PR4 --;

Column 18,
Line 37, "$T_3$-T0" should be -- T3-T0 --;

Column 19,
Line 38, after "Codec" insert -- 100. --.

Signed and Sealed this

Twenty-first Day of March, 2006

JON W. DUDAS
*Director of the United States Patent and Trademark Office*